United States Patent [19]

Iwahashi

[11] Patent Number: 5,428,570
[45] Date of Patent: Jun. 27, 1995

[54] NONVOLATILE SEMICONDUCTOR MEMORY DEVICE

[75] Inventor: Hiroshi Iwahashi, Yokohama, Japan

[73] Assignee: Kabushiki Kaisha Toshiba, Kawasaki, Japan

[21] Appl. No.: 67,987

[22] Filed: May 27, 1993

[30] Foreign Application Priority Data

May 28, 1992 [JP] Japan .................. 4-137281

[51] Int. Cl.⁶ .............................................. G11C 7/00
[52] U.S. Cl. .................. 365/185; 365/189.07; 365/201; 365/210
[58] Field of Search .............. 365/185, 201, 189.07, 365/210

[56] References Cited

U.S. PATENT DOCUMENTS

| | | | |
|---|---|---|---|
| 5,258,958 | 11/1993 | Iwahashi et al. | 365/208 X |
| 5,299,162 | 3/1994 | Kim et al. | 365/185 X |
| 5,305,273 | 4/1994 | Jinbo | 365/185 X |
| 5,321,655 | 6/1994 | Iwahashi et al. | 365/210 X |

Primary Examiner—Do Hyun Yoo
Attorney, Agent, or Firm—Finnegan, Henderson, Farabow, Garrett & Dunner

[57] ABSTRACT

Memory cells are arrange in the row and column directions in the form of a matrix. A transistor as a load is connected to column lines. A sense amplifier is connected to the transistor. In a read check operation, in which the data in the memory cells are erased, and the erased state of each memory cell is checked, all the row lines are set in a non-selected state by a row decoder, and all the column lines are selected by a column decoder. In this state. the sum of currents flowing in the memory cells is detected by the sense amplifier. When the current detected by the sense amplifier becomes a predetermined value, a data erase operation is ended.

4 Claims, 16 Drawing Sheets

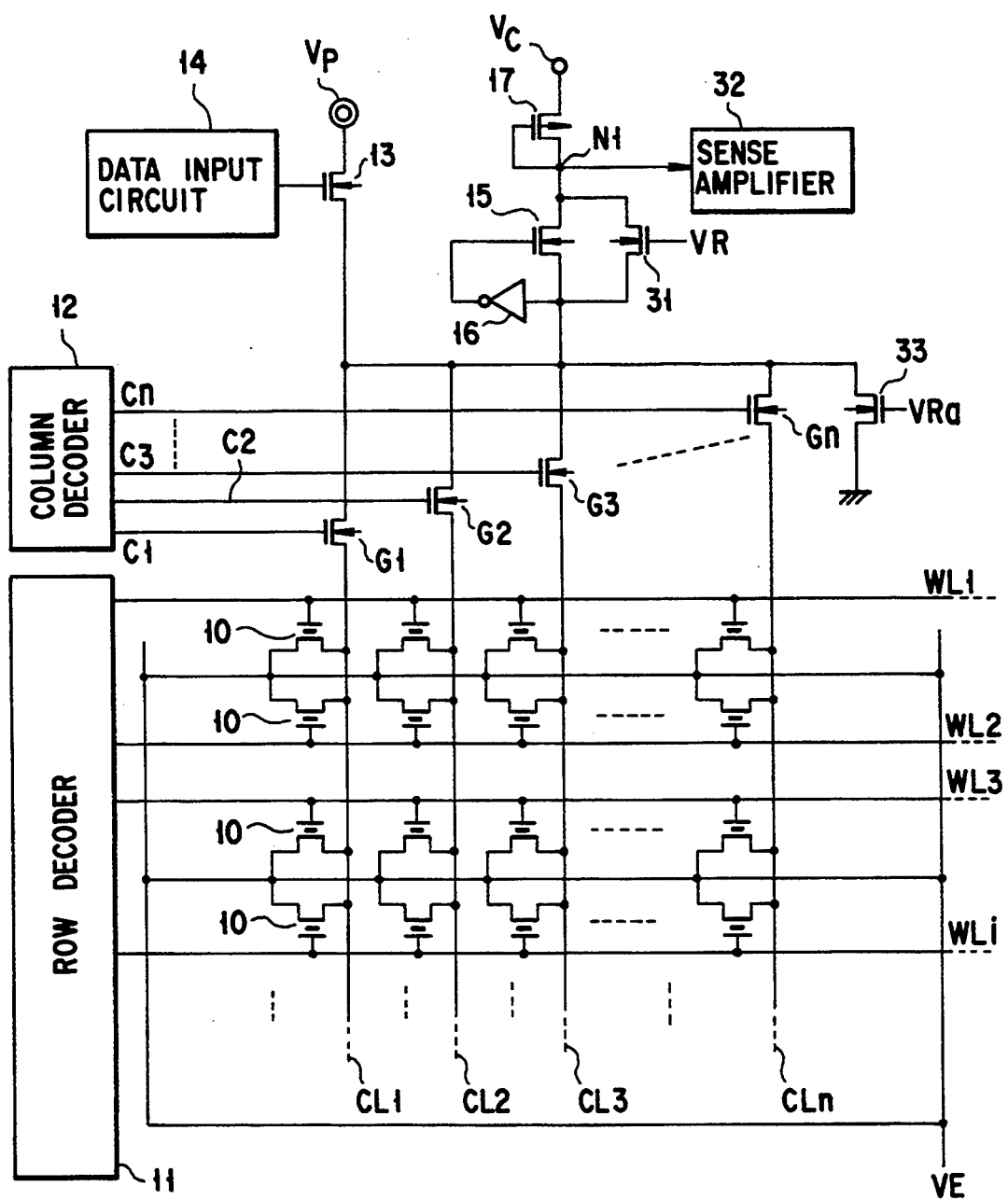
F I G. 1

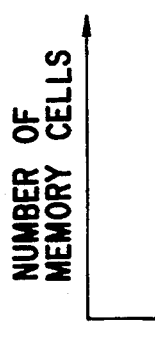
F I G. 5A
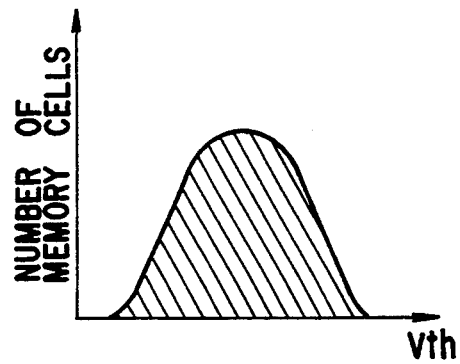
F I G. 5B
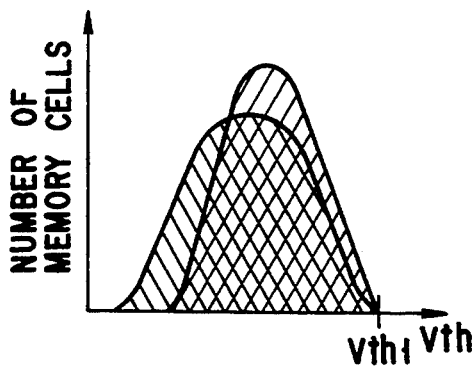
F I G. 5C

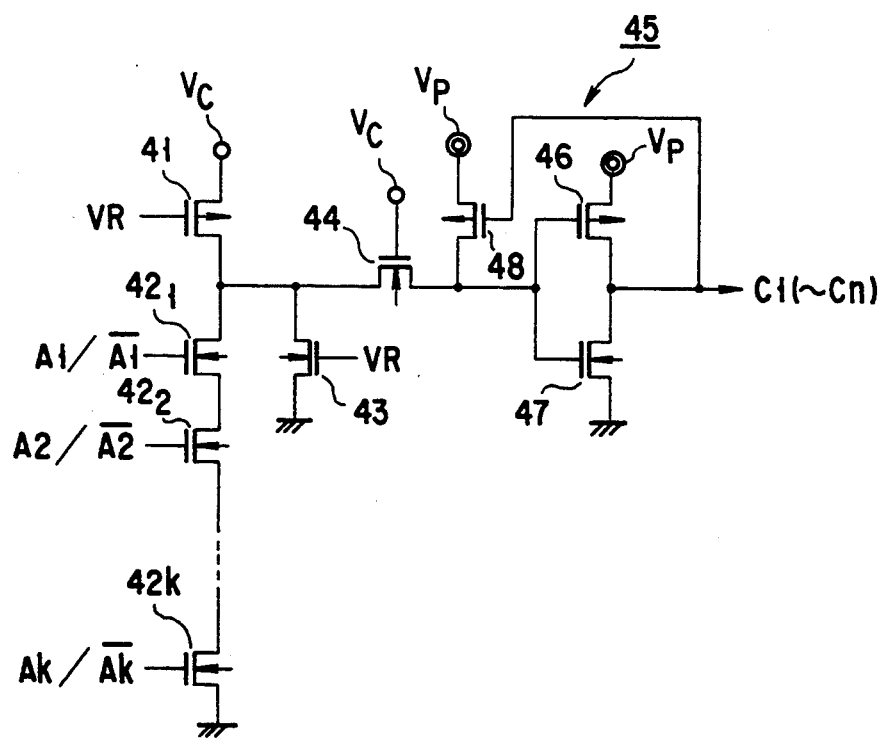
F I G. 7
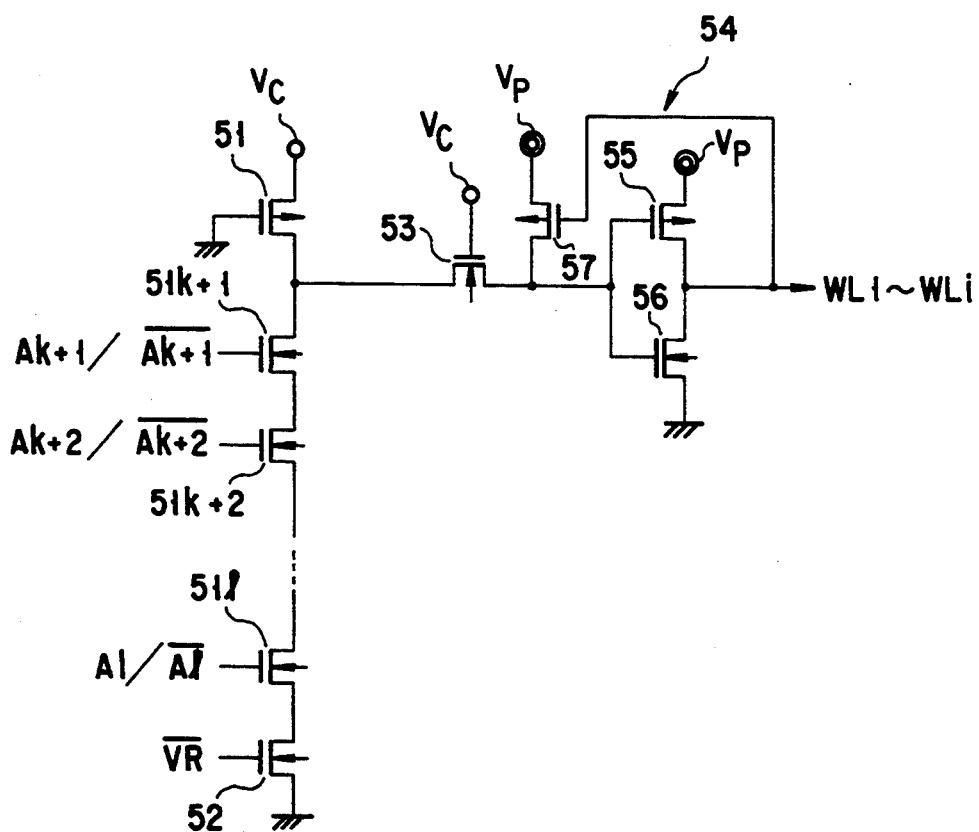
F I G. 8

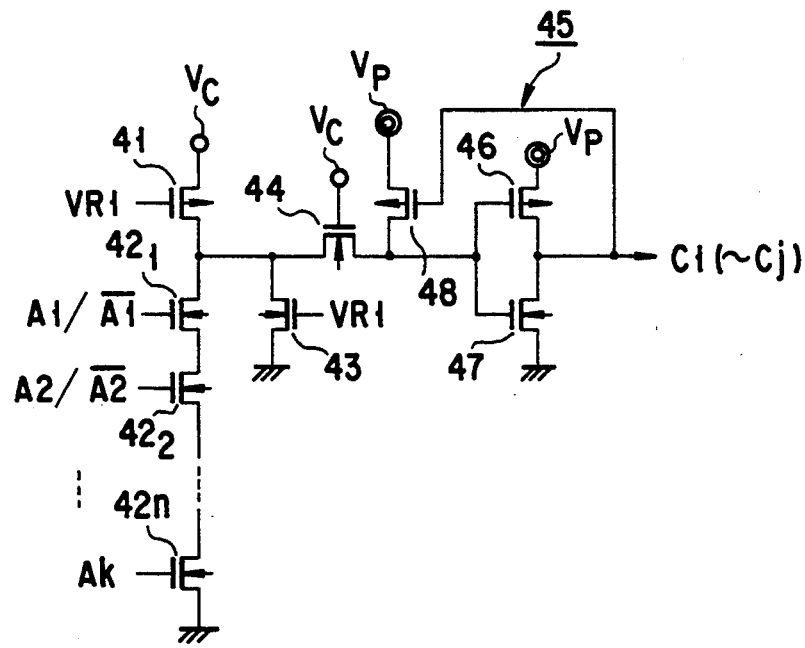
F I G. 9A
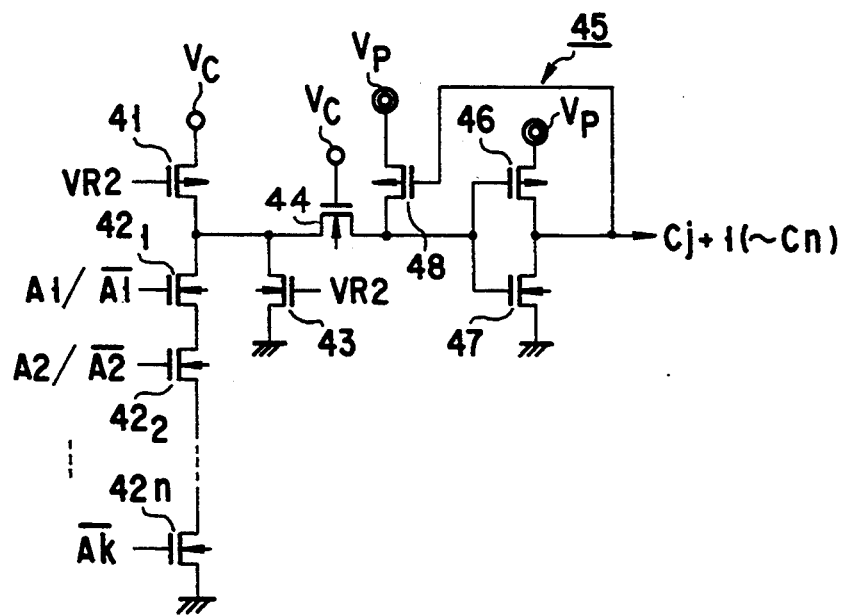
F I G. 9B
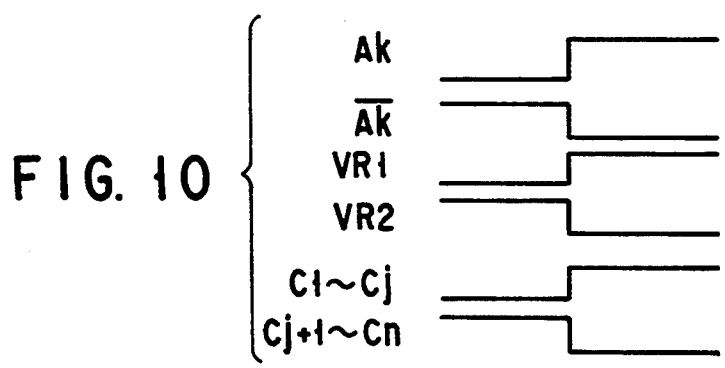
F I G. 10

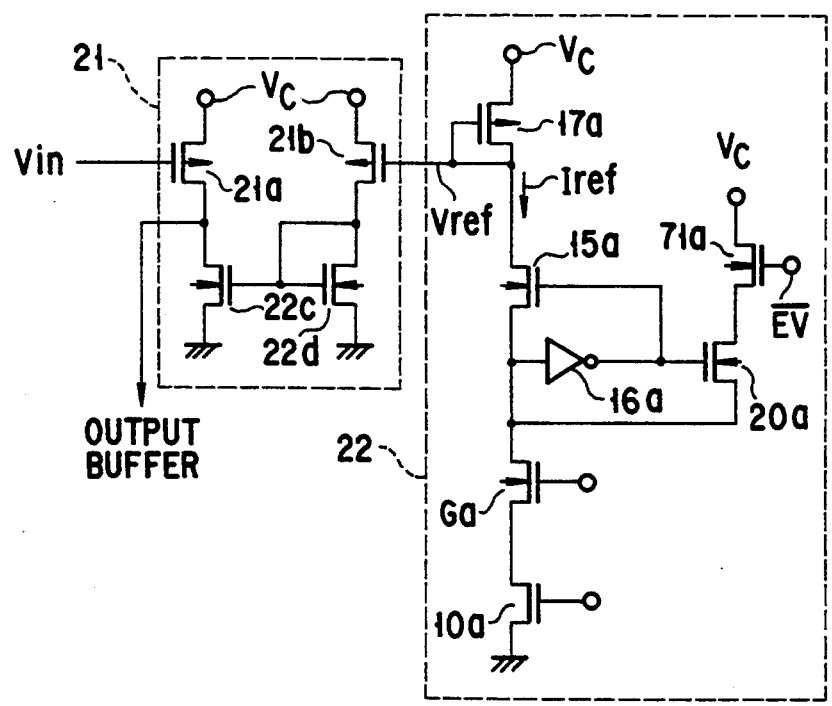
F I G. 13
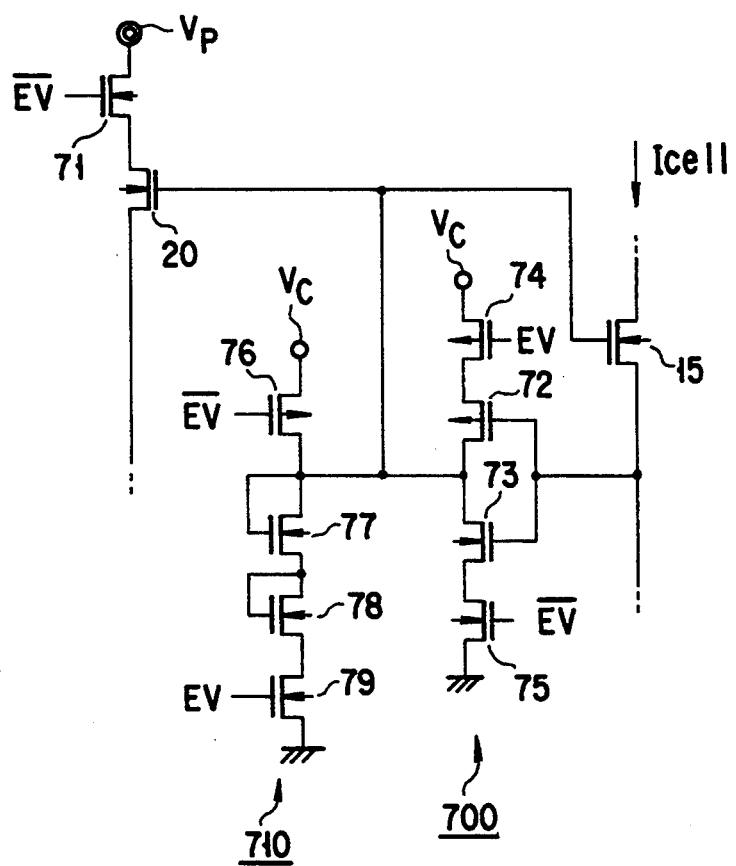
F I G. 14

| P1 | P2 | P3 | |
|----|----|----|---|
| '1' | '0' | '0' | RE-ERASE OPERATION |
| '1' | '1' | '1' | END OF ERASE OPERATION |
| '1' | '1' | '0' | ONE ERASE OPERATION |
F I G. 21
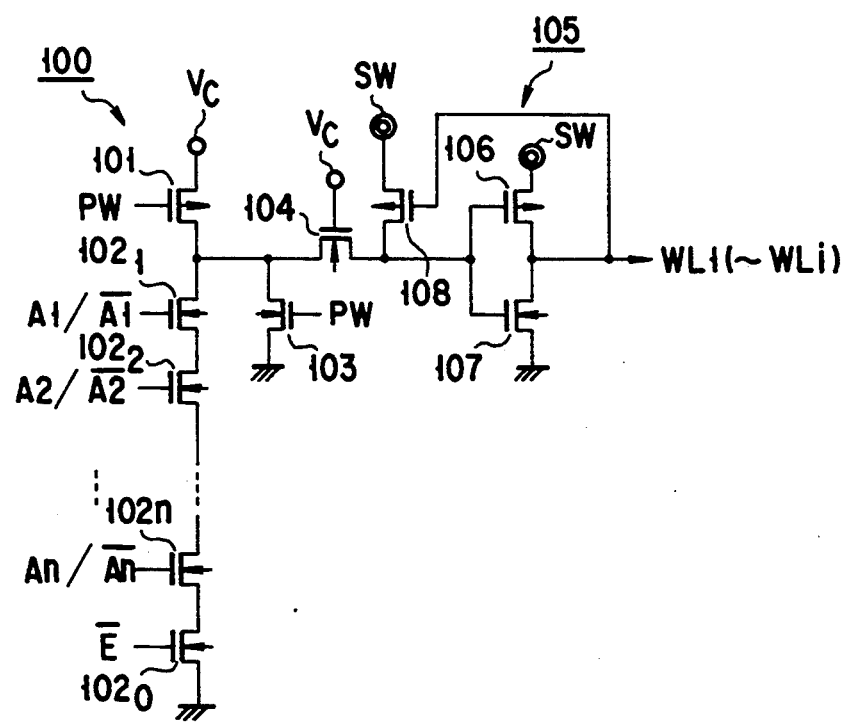
F I G. 22
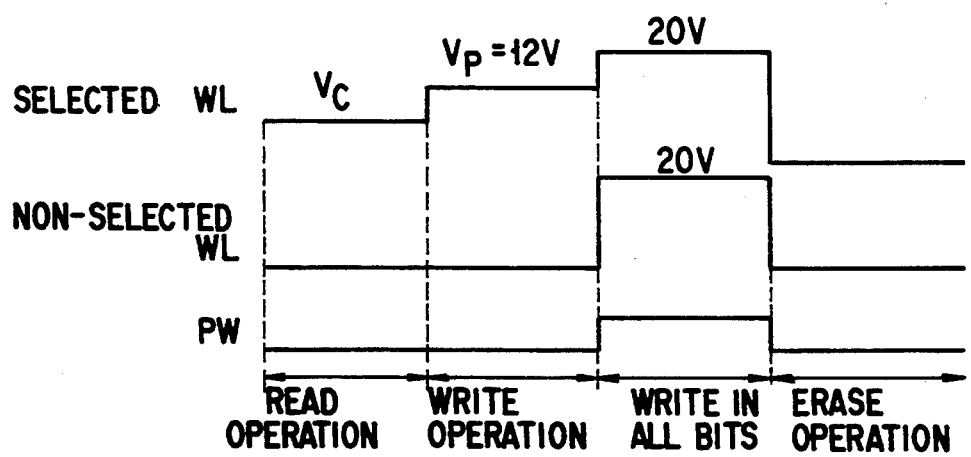
F I G. 23

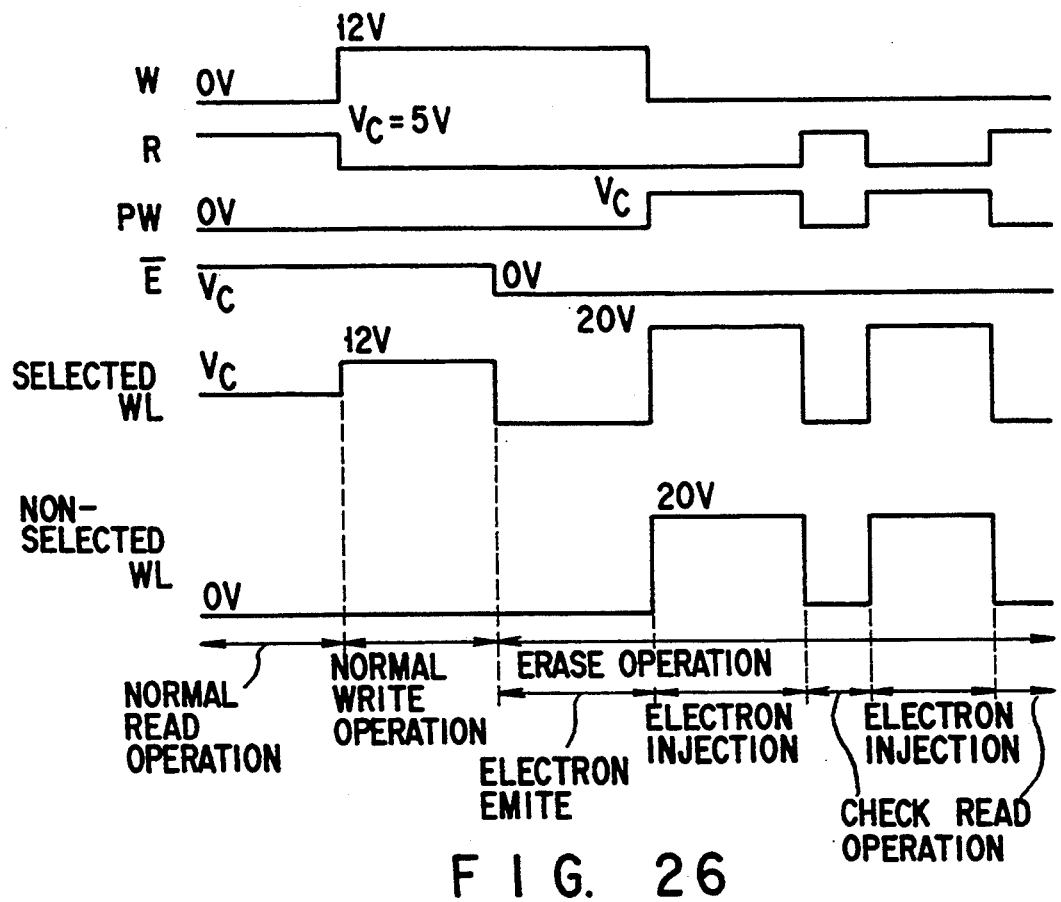
F I G. 26
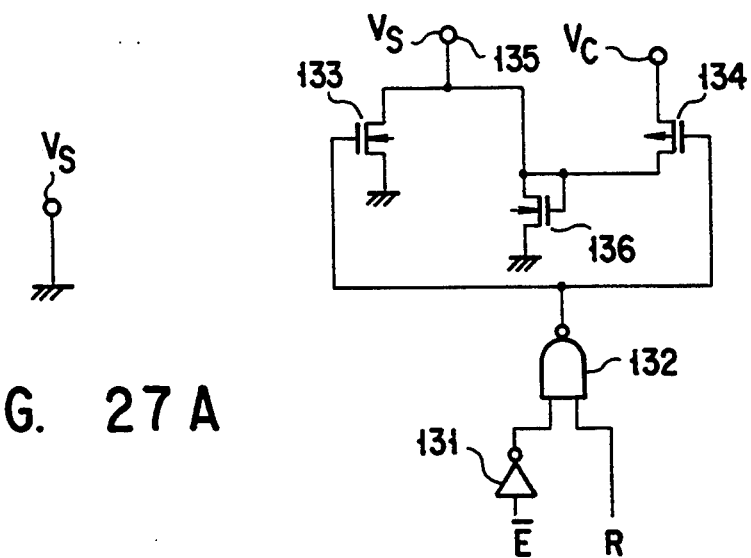
F I G. 27A
F I G. 27B

NONVOLATILE SEMICONDUCTOR MEMORY DEVICE

BACKGROUND OF THE INVENTION

1. Field of the Invention

The present invention relates to a nonvolatile semiconductor memory device and, more particularly, to an erasure check operation to be performed when data stored in a flash EEPROM (Electrically Erasable Programmable Read Only Memory) is erased.

2. Description of the Related Art

FIG. 2 shows a conventional NOR type flash EEPROM. In this flash EEPROM, memory cells 10 respectively having floating gates are arranged in the form of a matrix. The control gates of the memory cells 10 are respectively connected to row lines WL1, WL2, WL3, ..., WLi. The respective row lines WL1, WL2, WL3, ..., WLi are connected to a row decoder 11. The sources of the memory cells 10 are connected to a power supply VE. The drains of the memory cells 10 are respectively connected to column lines CL1, CL2, CL3, ..., CLn. The sources of n-channel transistors G1, G2, G3, ..., Gn are connected to the column lines CL1, CL2, CL3, ..., CLn, respectively. The gates of the transistors G1, G2, G3, ..., Gn are connected to a column decoder 12. The drains of the transistors G1, G2, G3, ..., Gn are connected to a high-voltage power supply Vp (12 V) through an n-channel transistor 13. The gate of the transistor 13 is connected to a data input circuit 14.

The drains of the transistors G1, G2, G3, ..., Gn are connected to the source of an n-channel transistor 15 and are also connected to the gate of the transistor 15 through a feedback inverter circuit 16. The drain of the transistor 15 is connected to a sense amplifier (not shown) and is also connected to the gate and drain of a p-channel load transistor 17. The source of the load transistor 17 is connected to a power supply Vc.

In the above-described arrangement, when data is to be read out from a memory cell, one row line and one column line are selected from a plurality of row lines and a plurality of column lines by the row decoder 11 and the column decoder 12, respectively, and data is read out from the memory cell 10 located at the intersection between the selected row and column lines.

When the data stored in a memory cell 10 is to be erased, a high voltage VE is applied to the source of the memory cell 10 to emit electrons from the floating gate of the memory cell to its source.

When data is to be written in a memory cell 10, a high voltage from the power supply Vp is applied to the gate and drain of the memory cell 10, selected in the above-described manner, through the n-channel transistor 13 to cause a current to flow in the channel region of the memory cell 10 so as to generate electron-hole pairs, thus injecting electrons from the channel into the floating gate of the memory cell 10.

In a data erase operation in the above-described flash EEPROM, if an excessive amount of electrons are emitted from the floating gate of a memory cell, the threshold voltage of the memory cell becomes a negative value. Consequently, each non-selected memory cell whose gate voltage is set to 0 V is also rendered conductive, disabling a selecting operation. In the conventional EEPROM, therefore, erase and read operations are performed repeatedly, and the electron-emitted state of the floating gate is checked in each read operation so that erasure is stopped when the threshold voltage of the memory cell reaches a proper value. More specifically, the time required for one erase operation is set to be short to prevent a memory cell from having a negative threshold voltage after one erase operation, and the electron-emitted state of the floating gate is checked by reading out data from the memory cell after every data erasure. When the threshold voltage reaches a proper value, erasure is stopped.

As described above, in the conventional EEPROM, erase and read operations are performed repeatedly. In the read operation, all the memory cells are sequentially selected to read out data therefrom. Therefore, it takes much time to erase the data stored in a memory cell.

FIG. 3 shows a conventional flash EEPROM. The same reference numerals in FIG. 3 denote the same parts as in FIG. 2. The arrangement shown in FIG. 3 is different from that shown in FIG. 2 in that the source of an n-channel transistor 20 is connected to the drains of the transistors G1, G2, G3, ..., Gn. The gate of the transistor 20 is connected to the output terminal of the inverter circuit 16. The drain of the transistor 20 is connected to the power supply Vc.

Similar to the flash EEPROM in FIG. 2, in the flash EEPROM shown in FIG. 3, the time required for one erase operation is set to be short to prevent a memory cell from having a negative threshold voltage after one erase operation, and the electron-emitted state of the floating gate is checked by reading out data from the memory cell after every data erasure. When the threshold voltage reaches a proper value, erasure is stopped.

The above-mentioned check operation is performed by using a sense amplifier 21 shown in FIG. 4. An input voltage Vin (corresponding to a current Icell flowing in a memory cell which has undergone data erasure) is applied to one input terminal of the sense amplifier 21, whereas a reference voltage Vref (corresponding to a reference current Iref) output from a reference circuit 22 is applied to the other input terminal. The reference circuit 22 has the same arrangement as that of an equivalent portion on the memory cell side shown in FIG. 3. The same reference numerals each with suffix "a" in FIG. 4 denote the same parts as in FIG. 3. Note that reference numeral 10a denotes a dummy cell.

The sense amplifier 21 compares the input voltage Vin with the reference voltage Vref output from the reference circuit 22. If the input voltage Vin is lower than the reference voltage Vref, data erasure of the memory cell is completed.

The degree to which the current Icell flowing in a memory cell increases, as a criterion for determining completion of data erasure, can be determined by the ratio of the current supply capacity of the load transistor 17 on the memory cell side to that of a load transistor 17a of the reference circuit 22. Assume that a pair of transistors 21a and 21b, and a pair of transistors 22c and 22d constituting the sense amplifier 21 have the same dimensions, respectively, and that the current supply capacity of the load transistor 17 on the memory cell side is half that of the load transistor 17a of the reference circuit 22. In this case, when the current Icell increases to nearly half of the reference current Iref, completion of data erasure is determined.

A data erase operation must be carefully performed to prevent a memory cell from having a negative threshold voltage after excessively emitting electrons from its floating gate. For this reason, setting of the currents Icell and Iref is important. As the difference in potential between Vin and Vref increases, determination can be more accurately performed by the sense amplifier 21. That is, the setting of Icell and Iref may be performed such that a great change in Vin is caused by a slight change in Icell, and a great change in the potential difference between Vin and Vref is caused by a slight change in Icell. In the conventional circuit shown in FIG. 3, the transistors 20 and 15 are controlled by the feedback inverter circuit 16 whose input terminal is connected to a column line. This arrangement is designed to increase the data read speed by reducing the amplitude of the potential of a column line. The transistor 15 amplifies the small potential amplitude of the column line and transfers it, as the input voltage Vin, to the sense amplifier 21. When an output from the column decoder 12 changes to select a new column line, the transistor 20 is used to rapidly charge the selected column line from 0 V.

In the conventional circuit shown in FIG. 3, since the two transistors 20 and 17 serve as loads with respect to a memory cell, when a current flows in the memory cell, currents also flow in the load transistors 20 and 17. The sense amplifier 21 checks an erased state on the basis of currents flowing in the transistors 21a and 21b. For this reason, a current component flowing in the load transistor 17 cannot be accurately checked as a current flowing in the memory cell itself. As the data in the memory cell is erased and the current flowing in the memory cell itself increases, the current flowing in the load transistor 20 increases, resulting in an increase in error.

As the current flowing in the memory cell itself increases in the process of data erasure, the current is also compensated by the transistor 20. Therefore, a change in Vin is small as compared with an increase in current flowing in the memory cell itself.

As described above, in the conventional circuit shown in FIG. 3, a change in Vin is small as compared with an increase in current flowing in a memory cell itself, and the current flowing in the memory cell itself cannot be accurately monitored.

As described above, in data erasure of the flash EEPROM shown in FIG. 2, the time required for one erase operation is set to be short to prevent a memory cell from having a negative threshold voltage after one erase operation, and the electron-emitted state of the floating gate is checked by reading out data from the memory cell after every data erasure. When the threshold voltage reaches a proper value, erasure is stopped.

In erasing the data stored in a memory cell, the erase time varies depending on the amount of electrons in the floating gate at the start time of data erasure. For this reason, in order to reduce variations in the threshold voltages of the erased memory cells, data erasure is performed after data are written in all the memory cells. That is, an erase operation is performed after electrons are injected into the floating gates of all the memory cells.

Even if, however, an erase operation is performed by such a method, the threshold voltages of all the memory cells after the erase operation do not become uniform and vary according to a certain distribution owing to subtle variations in the quality of a gate oxide film and a manufacturing process. As described above, this distribution is formed because of subtle variations in the quality of a gate oxide film and a manufacturing process. The threshold voltages of the respective memory cells differ in units of the manufacturing lots.

FIGS. 5A and 5B show variations in the threshold voltages (Vth) of memory cells after data erasure in units of lots. The threshold voltages of memory cells vary in various ranges, e.g., a narrow range such as the one shown in FIG. 5A and a wide range such as the one shown in FIG. 5B.

The electron-emitted state of a floating gate is checked by reading data from the memory cell. In this check, completion of data erasure is determined by detecting whether the potential of the column line is lower than a predetermined potential. As described above, this read operation is performed by a sense amplifier and the like. If the potential of the column line is lower than a predetermined reference voltage, it is determined that the erase operation is completed. Although the threshold voltage of a memory cell which has undergone data erasure must not be a negative value, a lower threshold voltage is better in the interest of increasing the read speed by increasing a current flowing in the memory cell.

In the conventional memory devices, even with a lot having a wide distribution of threshold voltages as shown in FIG. 5B, a reference potential is determined such that the threshold voltage of a memory cell does not become a negative value after an erase operation. For this reason, as shown in FIG. 5C, a threshold voltage Vth1 of the lot shown in FIG. 5B is applied to even a lot having a narrow distribution of threshold voltages after data erasure, which exhibits a wide margin on the 0-V side as in FIG. 5A. In the conventional memory devices, a high threshold voltage is set for each memory cell regardless of whether the distribution of threshold voltages is narrow, and a lower threshold voltage can be set for each memory cell to allow an increase in data read speed. That is, the conventional memory devices are not suitable for a high-speed operation.

In the flash EEPROM shown in FIG. 2, data erasure is performed, after data is written in each memory cell (electrons are injected into the floating gates of all the memory cells.) This data writing operation is the same as a normal writing operation of a normal writing mode. For this reason, it takes much time to erase the data stored in a memory cell. That is, in the conventional memory devices, a data erase operation requires the sum of the time required to emit electrons from the floating gates of memory cells and the time required to write data.

SUMMARY OF THE INVENTION

It is the first object of the present invention to provide a nonvolatile semiconductor memory device which can shorten the erase time, as compared with the prior art, so as to increase the operation speed within the system.

It is the second object of the present invention to provide a nonvolatile semiconductor memory device which can accurately monitor a current flowing in a memory cell itself during an erase operation, and can increase a potential change in input voltage of a sense amplifier.

It is the third object of the present invention to provide a nonvolatile semiconductor memory device which can realize a high data read speed, with respect to memory cells exhibiting a narrow distribution of threshold voltages after an erase operation, by setting a lower threshold voltage after data erasure than that in the prior art, and ensures the same threshold voltage after data erasure as that in the prior art, with respect to memory cells exhibiting a wide distribution of threshold voltages after data erasure, thereby obtaining high-speed memory cells at a high rate without reducing the yield.

It is the fourth object of the present invention to provide a nonvolatile semiconductor memory device which can shorten the erase time, as compared with the prior art, in an erase operation in which data are written in memory cells, and the data are subsequently erased, thereby increasing the operation speed in the system.

In order to achieve the above first object of the present invention, there is provided a nonvolatile semiconductor memory device comprising: a memory cell array including memory cells arranged in matrix form having row lines and column lines, each of the memory cells including a MOS transistor having a floating gate, the memory cells in the same row being commonly connected to one of the row lines, the memory cells in the same column being commonly connected to one of the column lines; a row decoder for selecting at least one of the row lines; a column decoder for selecting at least one of the column lines; a load circuit connected to the memory cells; and check means for checking a storage state of charges of the floating gate of each of the memory cells in accordance with a potential of a connection node between the load circuit and the memory cell while all the row lines are set in a non-selected state by the row decoder, and at least one column line is selected by the column decoder.

In order to achieve the above second object of the present invention, there is provided a nonvolatile semiconductor memory device comprising: a memory cell array including memory cells arranged in matrix form having row lines and column lines, each of the memory cells including a MOS transistor having a floating gate, the memory cells in the same row being commonly connected to one of the row lines, the memory cells in the same column being commonly connected to one of the column lines; a row decoder for selecting at least one of the row lines; a column decoder for selecting at least one of the column lines; a first load circuit connected to the column line; a data detection circuit, connected to the first load circuit, for detecting data stored in each of the memory cells; a first transistor having a current path inserted between the first load circuit and the column line; a second load circuit having a current path whose one end is connected to the column line; and control means for setting the second load circuit in a nonconducting state in a read check operation in which the data in the memory cell is erased, and data is read out from the memory cell to check an erased state of the memory cell.

In order to achieve the above third object of the present invention, there is provided a nonvolatile semiconductor memory device comprising: a memory cell array including memory cells arranged in row and column directions in the form of a matrix, each of the memory cells including a MOS transistor having a floating gate, and storing data in accordance with a storage state of charges of the floating gate; programming means for programming the storage state of the memory cell by injecting charges into the floating gate of the memory cell or by emitting charge from the floating gate; check means for checking the storage state of charges in the floating gate of the memory cell by reading out data from the memory cell, the memory cell having a threshold voltage varying depending on the amount of charges in the floating gate; and programming stop means for stopping the programming, wherein the programming stop means counts the number of memory cells having threshold voltages between two predetermined reference voltages in response to an output signal from the check means, and stops programming performed by the programming means when the count becomes smaller than a predetermined value.

In order to achieve the above fourth object of the present invention, there is provided a nonvolatile semiconductor memory device comprising: a memory cell array including memory cells arranged in matrix form having row lines and column lines, each of the memory cells including a MOS transistor having a control gate and a floating gate, the memory cells in the same row being commonly connected to one of the row lines, the memory cells in the same column being commonly connected to one of the column lines; a row decoder for selecting at least one of the row lines; a column decoder for selecting at least one of the column lines; data detection means, connected to the column line, for detecting data stored in the memory cell selected by the row and col-umn decoders; data write means for writing data in the memory cell; data erase means for erasing data from the memory cell; and data initializing means for simultaneously initializing data in a plurality of memory cells by applying a high voltage to the control gate of each of the memory cells to inject electrons into the float-ing gate using a tunnel effect while a plurality of row lines are selected by the row decoder

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a circuit diagram showing the first embodiment of the present invention corresponding to the first object;

FIGS. 5A, 5B, and 5C are graphs showing variations in the threshold voltages of memory cells after data erasure;

FIG. 7 is a circuit diagram showing a column decoder applied to the present invention;

FIG. 8 is a circuit diagram showing a row decoder applied to the present invention;

FIGS. 9A and 9B are circuit diagrams, each showing another column decoder applied to the present invention;

FIG. 10 is a timing chart for explaining operations of the circuits shown in FIGS. 9A and 9B;

FIG. 13 is a circuit diagram showing a reference circuit applied to the circuit shown in FIG. 12;

FIG. 14 is a circuit diagram showing a modification of a feedback inverter circuit applied to the circuit shown in FIG. 12;

FIG. 21 is a view for explaining an operation of the circuit in FIG. 19;

FIG. 22 is a circuit diagram showing a main part of a row decoder according to the sixth embodiment of the present invention;

FIG. 23 is a timing chart for explaining an operation of the circuit in FIG. 22;

FIG. 26 is a timing chart for explaining an operation of the circuit in FIG. 25; and FIGS. 27A and 27B are circuit diagrams, each showing a circuit for generating a voltage Vs applied to a row line WL in a check read operation,

DETAILED DESCRIPTION OF THE PREFERRED EMBODIMENTS

Figure 2:
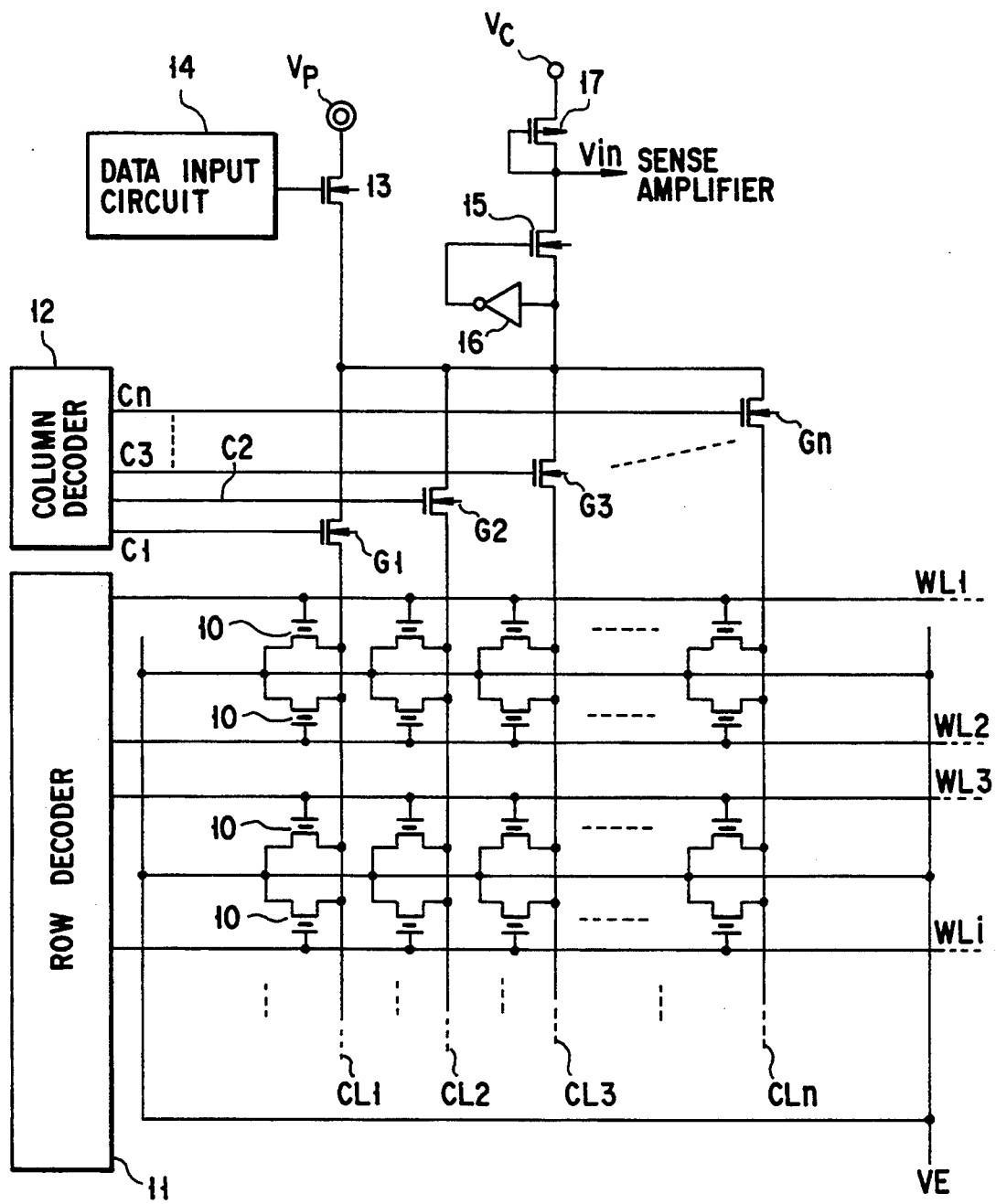
FIG. 2 is a circuit diagram showing a conventional flash EEPROM.

The embodiments of the present invention will be described below with reference to the accompanying drawings.

FIG. 1 shows the first embodiment of the present invention corresponding to the first object. The same reference numerals in FIG. 1 denote the same parts as in FIG. 2, and only different portions will be described below.

Referring to FIG. 1, the drain and source of an n-channel transistor 31 are respectively connected to the drain and source of a transistor 15. A signal VR is supplied to the gate of the n-channel transistor 31. A sense amplifier 32 is connected to a connection node N1 between the drain of a load transistor 17 and the drain of the transistor 15. The drain of an n-channel transistor 33 is commonly connected to the drains of transistors G1 to Gn. The source of the transistor 33 is grounded. A signal VRa is supplied to the gate of the transistor 33.

In the above-described arrangement, the data stored in a memory cell 10 is erased in the same manner as in the arrangement shown in FIG. 2. That is, all row lines WL1 to WLi are set at 0 V, and a high voltage is applied to a power supply VE to emit electrons from the floating gates of the memory cells 10 to their sources.

Figures 6A, 6B:
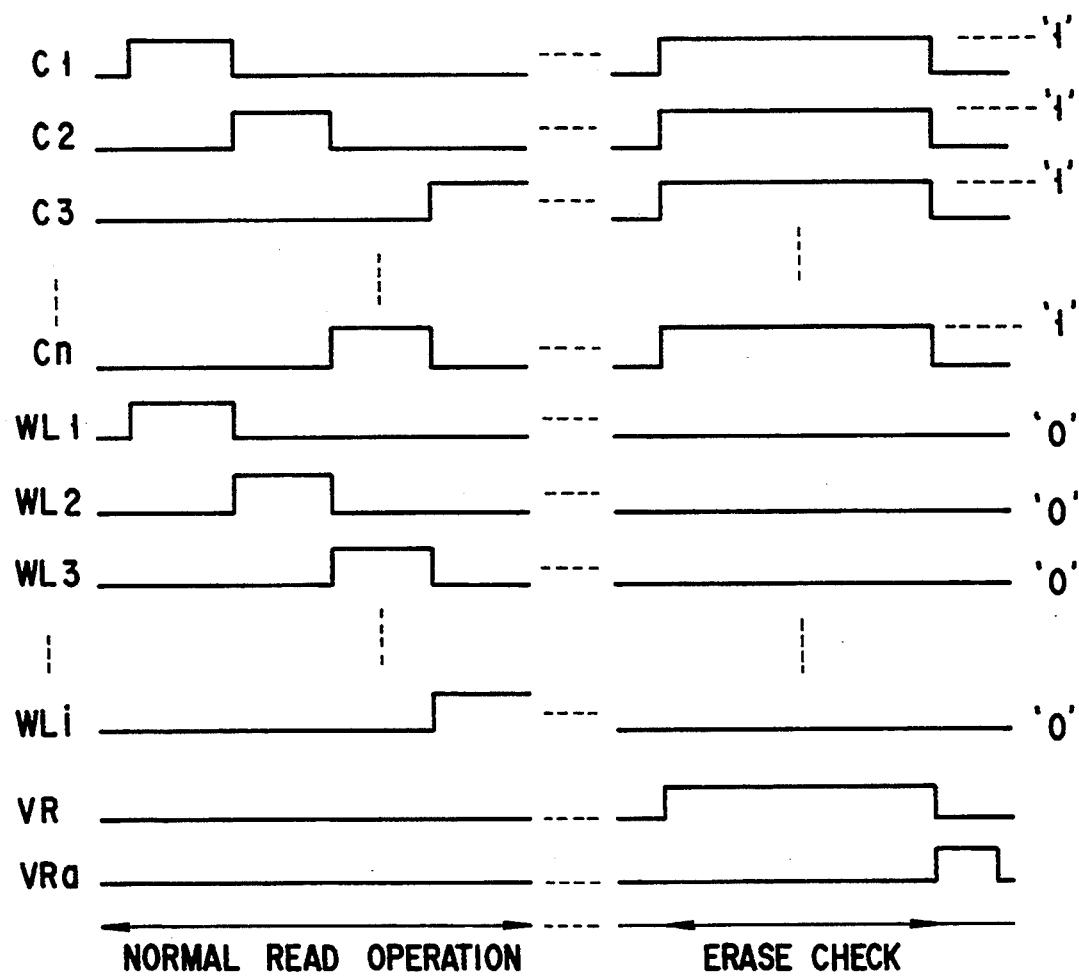
FIGS. 6A and 6B are timing charts for explaining an operation of the circuit shown in FIG. 1.

A normal data read operation is performed in the manner shown in FIG. 6A. First, one of the row lines WL1 to WLi is set at logic "1", e.g., 5 V. One of the transistors G1, G2, G3, . . . , Gn is turned on by a column decoder 12 to select one of the column lines CL1 to CLn. Data is read from the memory cell located at the intersection between the selected row and column lines. A memory cell of which the floating gate electrons are injected into at a normal writing operation is kept OFF even if it is selected. In contrast to this, a memory cell in an erased state is turned on. Binary data is stored in accordance with whether a memory cell is turned on or off in this manner.

In the normal data read operation, the transistors 31 and 33 are kept off state by being applied the signals VR and VRa, respectively, of logic "0".

FIG. 6B shows signals at the respective components, appearing in a check read operation for checking a data-erased state. In this check, all the row lines WL1 to WLi are set in a non-selected state, i.e., logic "0" (0 V). All the outputs from the column decoder 12 are set in a selected state, i.e., logic "1", to turn on the transistors G1, G2, G3, . . . , Gn. As a result, all column lines CL1, CL2, CL3, . . . , CLn are charged by a load transistor 17. At this time, the signal VR is set at logic "1" (the power supply Vc), and the signal VRa is kept at logic "0". Consequently, the transistor 31 is turned on, and the transistor 33 is turned off. Since the transistor 31 is turned on, each column line is set at a potential higher than that in a normal read operation. A sense amplifier 32 detects the potential of the connection node N1 between the load transistor 17 and the column lines.

Consider a memory having a 128K word×8 bit arrangement (FIG. 1 corresponds to 1 bit). The load transistor 17 is connected to the drains of 128,000 memory cells. Assume that as the data in memory cells are gradually erased, and the threshold voltage becomes a small negative value, a current of, e.g., 1 nA flows in one memory cell. In this case, a current of 128 μA flows in the 128,000 memory cells as a whole, and the potential of the connection node N1 decreases. The sense amplifier 32 detects this decrease in potential. Completion of data erasure can be determined on the basis of the detection output from the sense amplifier 32. The value of a current flowing in one memory cell, as a criterion for determining completion of data erasure, can be arbitrarily set on the basis of the current supply capacity of the load transistor 17 and the level of a potential detected by the sense amplifier 32. For example, 2,048 memory cells are connected to one column line. When a current of 1 nA flows in one memory cell, the total current flowing in the 2,048 memory cells is about 2 μA. The current flowing in a selected memory cell is about 100 μA. In comparison with this current, a current of about 2 μA is negligible. In a normal read operation, only one of the column line is selected. Therefore, even in the normal read operation, no error occurs. After verification, the signal VR is set at logic "0", and the transistor 31 is turned off. Subsequently, the signal VRa is set at logic "1", and the transistor 33 is turned on to discharge the potential of the column lines. When the discharge is completed, the signal VRa is set at logic "0" to turn off the transistor 33.

As described above, in a check read operation for checking a data-erased state, the transistor 31 is turned on to set the potential of the column lines to be higher than that in a normal read operation. With this setting, the threshold voltage of each memory cell in the check read mode can be set to be lower than that in the normal read mode by utilizing a short-channel effect. Therefore, even if a current of 1 nA flows in a memory cell in the check read mode, no current flows in a non-selected memory cell in the normal read mode. For this reason, the transistors 31 and 33 are not necessarily required.

According to the above-described embodiment, a plurality of memory cells are set in a non-selected state, and the sum of currents flowing in the respective memory cells is detected by the sense amplifier 32. If this detected current becomes a predetermined value, completion of data erasure is determined. Since check read operations are simultaneously performed with respect to a plurality of memory cells, the data erase time can be shortened as compared with the prior art.

FIG. 7 shows an example of the column decoder 12. More specifically, FIG. 7 shows only a portion of the column decoder 12. The source of a p-channel transistor 41 is connected to a power supply Vc. The signal VR is supplied to the gate of the transistor 41. A plurality of n-channel transistors $42_1$ to $42_k$ are connected in series between the drain of the transistor 41 and ground. Address signals $A_1$ ($\overline{A}_1$), $A_2$ ($\overline{A}_2$), ..., $A_k$ ($\overline{A}_k$) are respectively supplied to the gates of the transistors $42_1$ to $42_k$. An n-channel transistor 43 is connected between the drain of the transistor 41 and ground. The signal VR is supplied to the gate of the transistor 43. The drain of an n-channel transistor 44 is connected to the drain of the transistor 41. The power supply Vc is connected to the gate of the transistor 44. The source of the transistor 44 is connected to the gates of p- and n-channel transistors 46 and 47, and the drain of a p-channel transistor 48, which transistors constitute a latch circuit 45. The source and drain of the transistor 46 are respectively connected to a power supply Vp and the drain of the transistor 47. The source of the transistor 47 is grounded. The drains of the transistors 46 and 47 are connected to the gate of the transistor 48. The source of the transistor 48 is connected to the power supply Vp. Column selection signals C1 (to Cn) are output from the drains of the transistors 46 and 47.

In the above-described arrangement, when a check read operation is performed after data erasure, the signal VR is set at logic "1" to set all outputs from the column decoder 12 in a selected state. When this operation is performed, the power supply Vp is set to the same voltage of the power supply Vc.

FIG. 8 shows an example of the row decoder 11. More specifically, FIG. 8 shows only a portion of the row decoder 11. The source of a p-channel transistor 51 is connected to the power supply Vc. The gate of the transistor 51 is grounded. A plurality of n-channel transistors $51_{k+1}$ to $51_1$ and an n-channel transistor 52 are connected in series between the drain of the transistor 51 and ground. Address signals $A_{k+1}$ ($\overline{A}_{k+1}$), $A_{k+2}$ ($\overline{A}_{k+2}$), ..., $A_1$ ($\overline{A}_1$) are respectively supplied to the gates of the transistors $51_{k+1}$ to $51_1$. A signal $\overline{VR}$ is supplied to the gate of the transistor 52. The drain of an n-channel transistor 53 is connected to the drain of the transistor 51. The power supply Vc is connected to the gate of the transistor 53. The source of the transistor 53 is connected to the gates of p- and n-channel transistors 55 and 56, and the drain of a p-channel transistor 57, which transistors constitute a latch circuit 54. The source and drain of the transistor 55 are respectively connected to the power supply Vp and the drain of the transistor 56. The source of the transistor 56 is grounded. The drains of the transistors 55 and 56 are connected to the gate of the transistor 57. The source of the transistor 57 is connected to the power supply Vp. Row selection signals WL1 (to WLi) are output from the drains of the transistors 55 and 56.

In the above-described arrangement, in a check operation after data erasure, the inverted signal $\overline{VR}$ of the signal VR is set at logic "0", and the transistor 52 is turned off, thus setting all outputs WL from the row decoder 11 in a non-selected state, i.e., at logic "0".

In the embodiment shown in FIG. 1, in a check read operation after data erasure, all the outputs from the column decoder 12 are set in a selected state. However, the present invention is not limited to this. For example, check read operations may be performed in units of columns by using a general column decoder. In this case, the current supply capacity of the load transistor must be changed in accordance with the number of memory cells connected to one column line.

Column lines may be divided into a plurality of blocks so that check read operations may be performed in units of blocks. FIGS. 9A and 9B each show an example of the column decoder used in such a case. The same reference numerals in FIGS. 9A and 9B denote the same parts as in FIG. 7.

The column decoder shown in FIG. 9A outputs column selection signals C1 to Cj. The column decoder shown in FIG. 9B outputs column selection signals Cj+1 to Cn. Each of these column decoders is divided into two blocks in accordance with address signals Ak and $\overline{Ak}$. In this case, the signal VR is also divided into two signals VR1 and VR2 in accordance with the two blocks. In the column decoder shown in FIG. 9A, the signal VR1 is supplied to the gates of transistors 41 and 43. In the column decoder shown in FIG. 9B, the signal VR2 is supplied to the gates of transistors 41 and 43.

FIG. 10 shows the waveforms of the address signals Ak and $\overline{Ak}$, the signals VR1 and VR2, and the column selection signals C1 to Cj and Cj+1 to Cn.

In a data erase operation, the data in all the memory cells are not uniformly erased, and the degree of erasure varies among the memory cells. That is, memory cells from which data are erased at high speed, and memory cells from which data are erased at low speed are distributed with a certain range. As the range of variations in distribution becomes narrower, the variations in memory cell current after data erasure become smaller. Therefore, in the data read mode, setting of parameters such as the dimensions of each transistor is facilitated. In addition, the number of transistors subjected to simultaneous data erasure is preferably decreased to reduce the variations in memory cell current.

Figure 11:
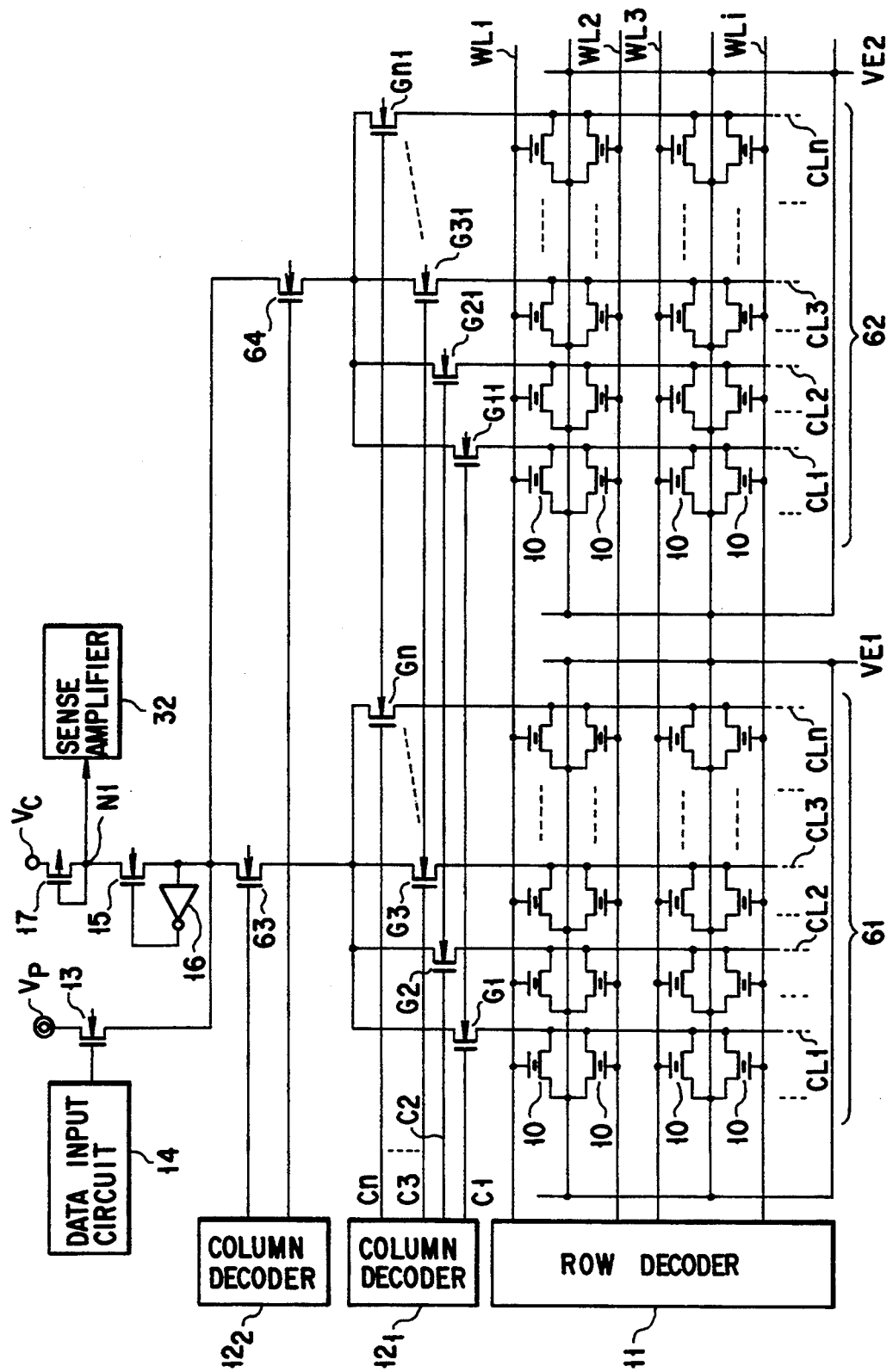
FIG. 11 is a circuit diagram showing the second embodiment of the present invention.

FIG. 11 shows the second embodiment of the present invention corresponding to the first object. The same reference numerals in FIG. 11 denote the same parts as in FIG. 1.

This embodiment includes two 1-bit memory cell arrays. In a first memory cell array block 61, a power supply VE1 is connected to the source of each memory cell 10. In a second memory cell array block 62, a power supply VE2 is connected to the source of each memory cell 10. These power supplies VE1 and VE2 are set at 0 V in the data read mode, and are set at a high voltage in the data erase mode.

Transistors G1, G2, ..., Gn, and transistors G11, G21, ..., Gn1 for respectively selecting column lines arranged in the first and second memory cell array blocks 61 and 62 are controlled by a first column decoder $12_1$. The drains of the transistors G1, G2, ..., Gn arranged in the first memory cell array block 61 are connected to the source of a transistor 15 through an n-channel transistor 63. The drains of the transistors G11, G21, ..., Gn1 arranged in the second memory cell array block 62 are connected to the source of the transistor 15 through an n-channel transistor 64. The gates of the transistors 63 and 64 are connected to a second column decoder 12₂. The first or second memory cell array block 61 or 62 is selected when the transistor 63 or 64 is selectively turned on by the second column decoder 12₂.

In the above-described arrangement, check read operations after data erasure are also performed in units of memory cell array blocks (the first and second memory cell array blocks). If completion of data erasure is determined by a check read operation, data erasure is not performed again with respect to the corresponding block. If it is determined by a check read operation that data erasure is insufficient, a high voltage is applied to the source of each memory cell again in the corresponding block, thus erasing the data stored therein.

According to this embodiment, in a nonvolatile semiconductor memory device having a plurality of memory cell array blocks, the time required to erase data can be shortened.

The third embodiment of the present invention corresponding to the second object will be described below.

Figure 3:
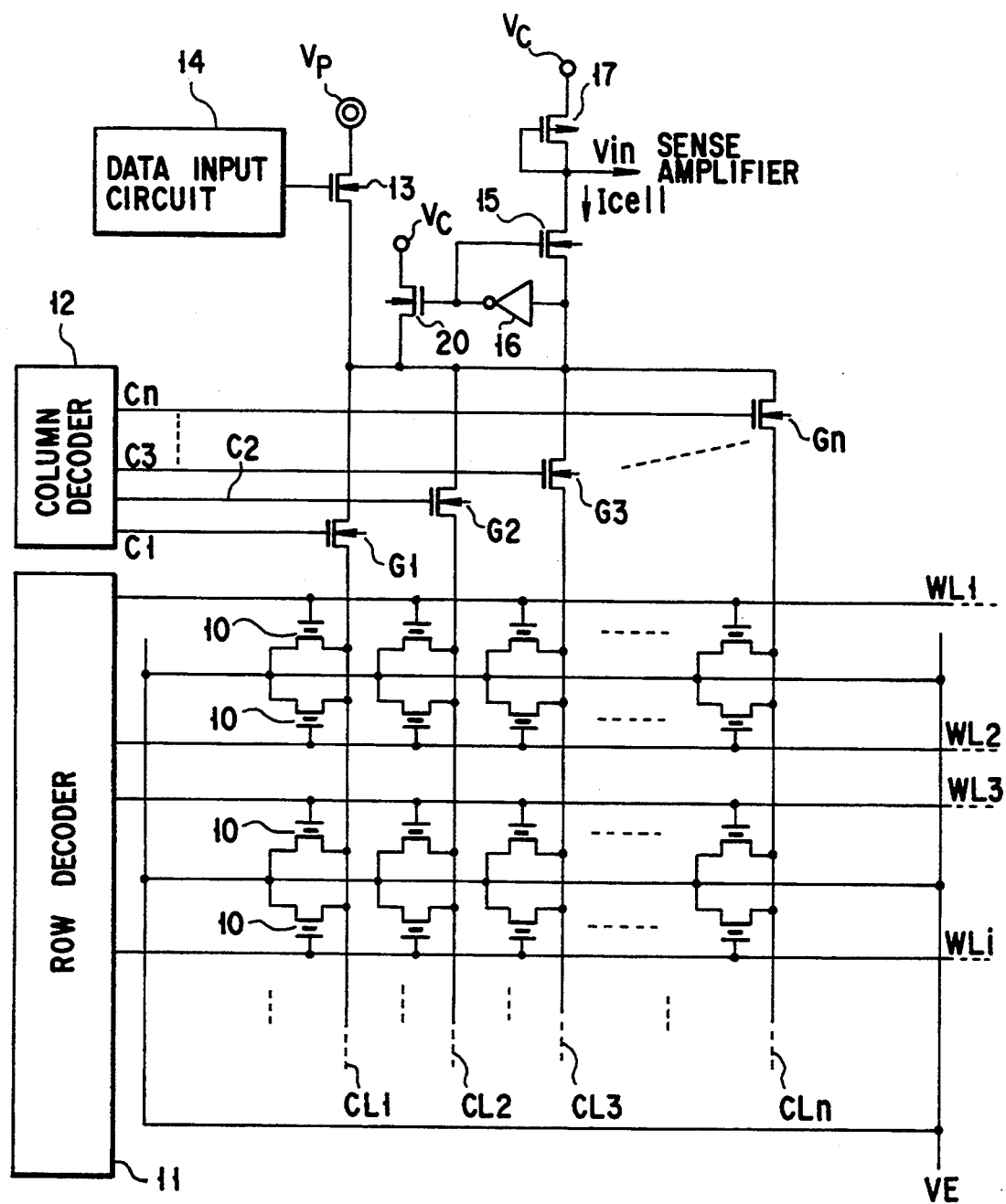
FIG. 3 is a circuit diagram showing another conventional flash EEPROM.

Unlike the first and second embodiments, in the third embodiment, a check read operation is not performed while all the memory cells are set in a nonselected state, but is performed by a normal read operation as in the prior art. More specifically, in this embodiment, after the data in memory cells are erased, an erasing state of a memory cell is checked by selecting the memory cells one by one and performing a check read operation as in a normal read operation. In the embodiment, however, the transistor 20 shown in FIG. 3 is not used to achieve the second object.

Figure 12:
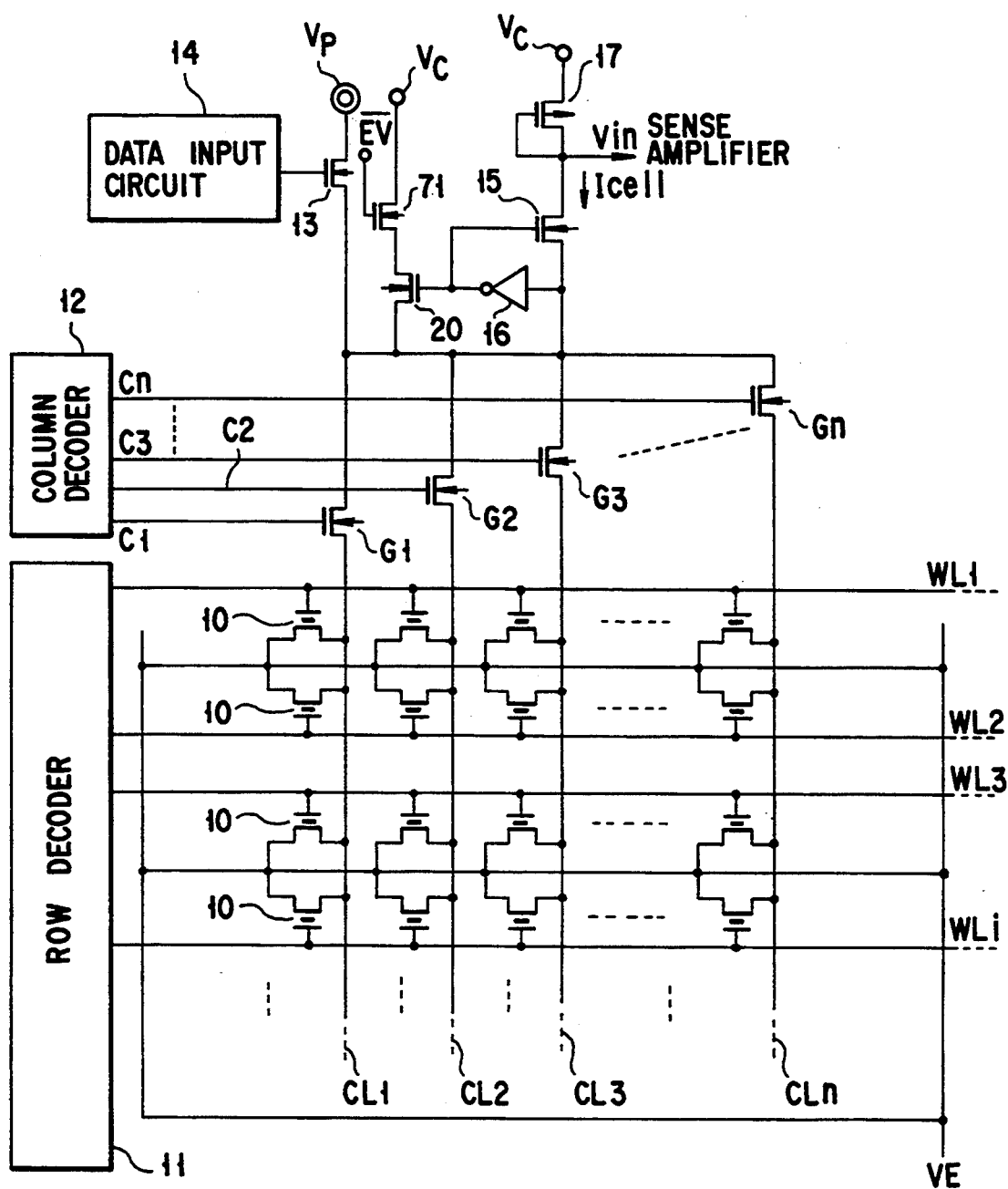
FIG. 12 is a circuit diagram showing the third embodiment of the present invention.

FIG. 12 shows the third embodiment. The same reference numerals in FIG. 12 denote the same parts as in FIG. 3.

Figure 4:
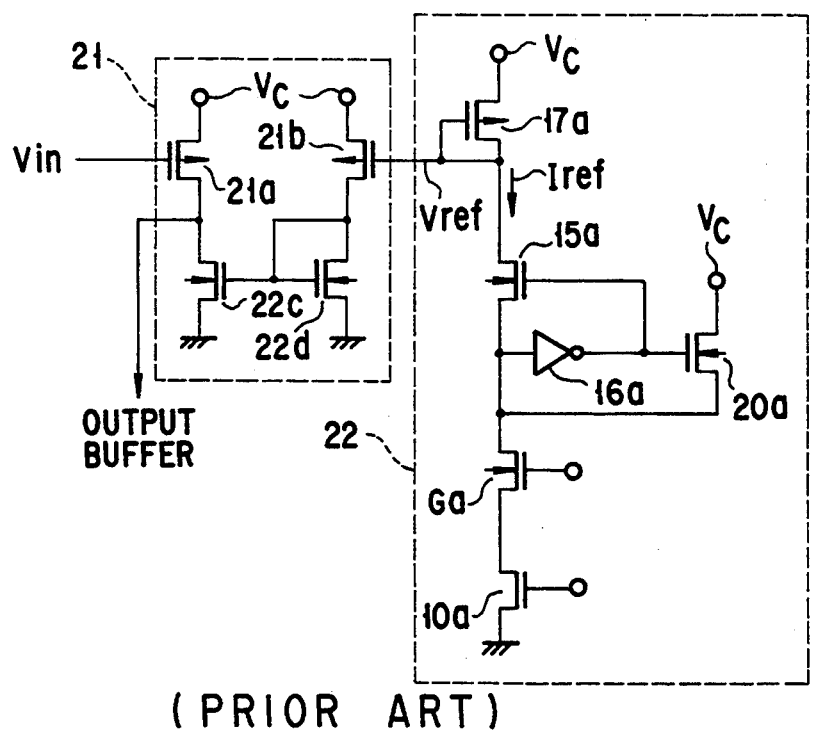
FIG. 4 is a circuit is a circuit diagram showing a conventional sense amplifier.

Referring to FIG. 12, the drain of a transistor 20 as a load transistor is connected to the source of an n-channel transistor 71. The drain of this transistor 71 is connected to a power supply Vc. A signal $\overline{EV}$ is supplied to the gate of the transistor 71. The signal $\overline{EV}$ is set at logic "0" in the check read mode for checking the erase state after data erasure, and is set at logic "1" in other modes. In a check read operation, therefore, the transistor 71 is turned off. While the transistor 71 is OFF, a current flowing in a memory cell is equal to a current Icell flowing in the load transistor 17. As is apparent, a transistor equivalent to the transistor 71 is also arranged in the reference circuit 22 shown in FIG. 4.

FIG. 13 shows a reference circuit applied to the third embodiment. The same reference numerals in FIG. 13 denote the same parts as in FIG. 4.

Referring to FIG. 13, an n-channel transistor 71a is inserted between the drain of a transistor 20a and the power supply Vc constituting the reference circuit 22. The signal $\overline{EV}$ is supplied to the gate of the n-channel transistor 71a.

With this arrangement, the current Icell flowing in the load transistor 17 accurately corresponds to the erased state of a memory cell. For this reason, a change in input voltage Vin to a current mirror circuit 21 can be increased in accordance with an increase in the current Icell upon erasure of data stored in a memory cell, as compared with the prior art.

FIG. 14 shows a modification of a feedback inverter circuit 16 applied to the embodiment. The gates of p- and n-channel transistors 72 and 73 constituting an inverter circuit 700 are connected to the source of the transistor 15. The source of the transistor 72 is connected to the drain of a p-channel transistor 74. A signal EV is supplied to the gate of the transistor 74. The source of the transistor 74 is connected to a power supply Vc. The source of the transistor 73 is connected to the drain of an n-channel transistor 75. A signal $\overline{EV}$ is supplied to the gate of the transistor 75. The source of the transistor 75 is grounded. The commonly connected drains of the transistors 72 and 73 are connected to the gate of the transistor 15 and to the gate of the transistor 20.

In addition, the commonly connected drains of the transistors 72 and 73 are connected to the drain of a p-channel transistor 76 and to the drain and gate of an n-channel transistor 77. The signal $\overline{EV}$ is supplied to the gate of the transistor 76. The source of the transistor 76 is connected to the power supply Vc. The source of the transistor 77 is connected to the drain and gate of an n-channel transistor 78. The source of the transistor 78 is connected to the drain of an n-channel transistor 79. A signal EV is supplied to the gate of the transistor 79. The source of the transistor 79 is grounded. The transistors 76 to 79 comprise a bias circuit 710.

In the above-described arrangement, in the check read mode for checking the erase state of a memory cell, the signal EV is set at logic "1", and the signal $\overline{EV}$ is set at logic "0". Consequently, the transistors 74 and 75 are turned off, and an output signal from the circuit 710 is supplied to the gate of the transistor 15. This output signal is almost equal to the sum of the threshold voltages of the transistors 77 and 78, and the transistor 15 is controlled by a substantially constant voltage. If the inverter circuit 16 is used, the input voltage Vin to the sense amplifier 21 steeply changes in a region where the current Icell is small, but gradually changes in a region where the current Icell is large. In the circuit 710 shown in FIG. 14, however, the input voltage Vin almost uniformly changes both in the region where the current Icell is small and in the region where the current Icell is large. Therefore, whether to use the circuit 710 shown in FIG. 14 or the inverter circuit 16 in the check read mode may be determined in accordance with the set value of the current Icell.

In the circuit shown in FIG. 14, in a normal read operation, the transistors 76 and 79 are turned off, and the transistors 74 and 75 are turned on. In addition, the transistors 72 and 73 serve as a feedback inverter circuit, and output signals from the transistors 72 and 73 are respectively supplied to the gates of the transistors 15 and 20.

According to the above embodiment, a current flowing in a memory cell itself can be accurately monitored, and a potential change in Vin can be set to be large. Therefore, the erased state of a memory cell can be more accurately checked than the prior art.

The fourth embodiment of the present invention corresponding to the third object will be described next.

In this embodiment, two different reference potentials are used instead of one reference potential as in the prior art, and the number of memory cells whose threshold voltages are between the two reference potentials is counted. If the count value becomes smaller than a predetermined value, the erase operation is stopped, thereby achieving the third object.

Figure 15:
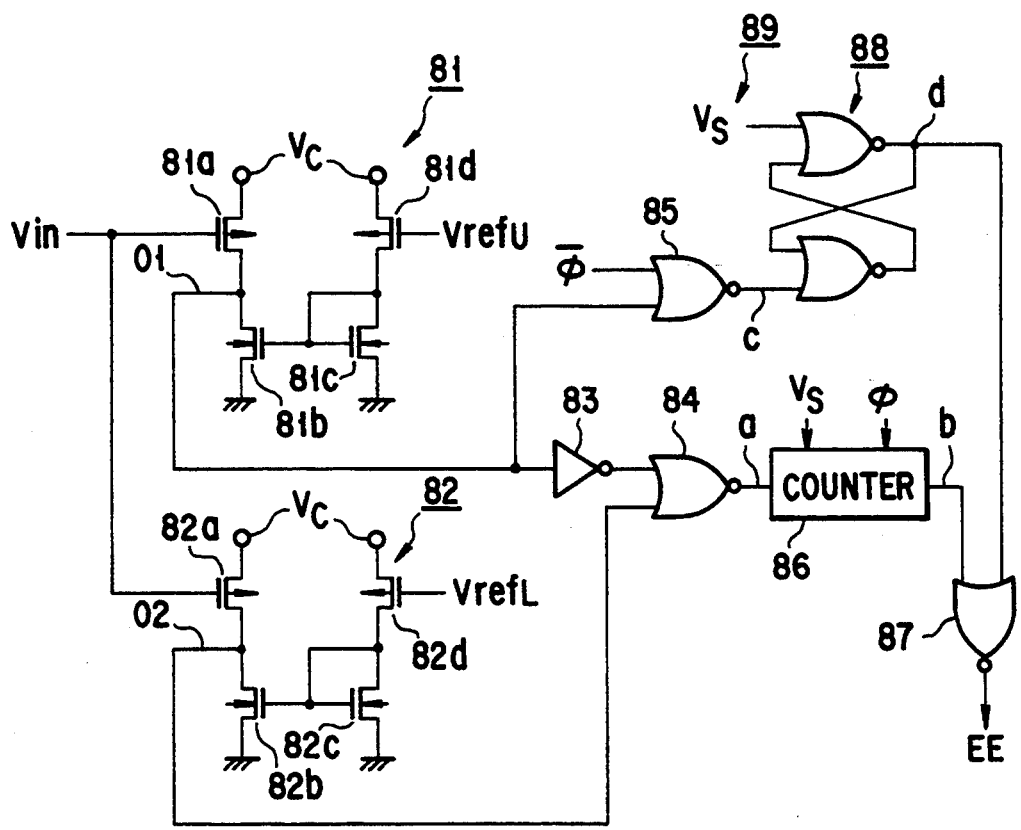
FIG. 15 is a circuit diagram showing the fourth embodiment of the present invention.

FIG. 15 shows the fourth embodiment. The circuit shown in FIG. 15 is constituted by first and second sense amplifiers 81 and 82 and a counter circuit 89.

The first and second sense amplifiers 81 and 82 each have one input terminal connected to the drain of a load transistor 17 shown in, e.g., FIG. 2. A potential Vin of a column through which data is read out from a selected memory cell is applied to one input terminal of each of these sense amplifiers. In the first sense amplifier 81, the potential Vin is applied to the gate of a p-channel transistor 81a. The source and drain of the transistor 81a are respectively connected to a power supply Vc and the drain of an n-channel transistor 81b. The source of the transistor 81b is grounded. The gate of the transistor 81b is connected to the gate and drain of an n-channel transistor 81c. The source of the transistor 81c is grounded. The drain of the transistor 81c is connected to the drain of a p-channel transistor 81d. The source of the transistor 81d is connected to the power supply Vc. A first reference potential VrefU is applied to the gate of the transistor 81d.

In the second sense amplifier 82, the potential Vin is applied to the gate of a p-channel transistor 82a. The source and drain of the transistor 82a are respectively connected to the power supply Vc and the drain of an n-channel transistor 82b. The source of the transistor 82b is grounded. The gate of the transistor 82b is connected to the gate and drain of an n-channel transistor 82c. The source of the transistor 82c is grounded. The drain of the transistor 82c is connected to the drain of a p-channel transistor 82d. The source of the transistor 82d is connected to the power supply Vc. A second reference potential VrefL is applied to the gate of the transistor 82d. The second reference potential VrefL is set to be lower than the first reference potential vrefU. The first and second reference potentials VrefU and VrefL correspond to threshold voltages Vth1 and Vth2 of memory cells shown in FIG. 17, respectively.

The node between the drains of the transistors 81a and 81b, serving as the output terminal of the first sense amplifier 81, is connected to one input terminal of a NOR circuit 84 through an inverter circuit 83 and is also connected to one input terminal of a NOR circuit 85. The other input terminal of the NOR circuit 84 is connected to the node between the drains of the transistors 82a and 82b, serving as the output terminal of the second sense amplifier 82. The output terminal of the NOR circuit 84 is connected to the input terminal of a counter 86. Signals Vs and $\bar{\phi}$ are supplied to the counter 86. The output terminal of the counter 86 is connected to one input terminal of a NOR circuit 87. The counter 86 counts output signals from the NOR circuit 84. More specifically, when data is read out from a selected memory cell, the counter 86 counts the number of memory cells whose column line potentials Vin are between the first and second reference potentials VrefU and VrefL.

A signal $\bar{\phi}$ is supplied to the other input terminal of the NOR circuit 85. The output terminal of the NOR circuit 85 is connected to one input terminal of a flip-flop circuit 88. The signal Vs is supplied to the other input terminal of the flip-flop circuit 88. The output terminal of the flip-flop circuit 88 is connected to the other input terminal of the NOR circuit 87. An output signal from the NOR circuit 87 is supplied to a control circuit (not shown) for performing data erase control.

Figure 16:
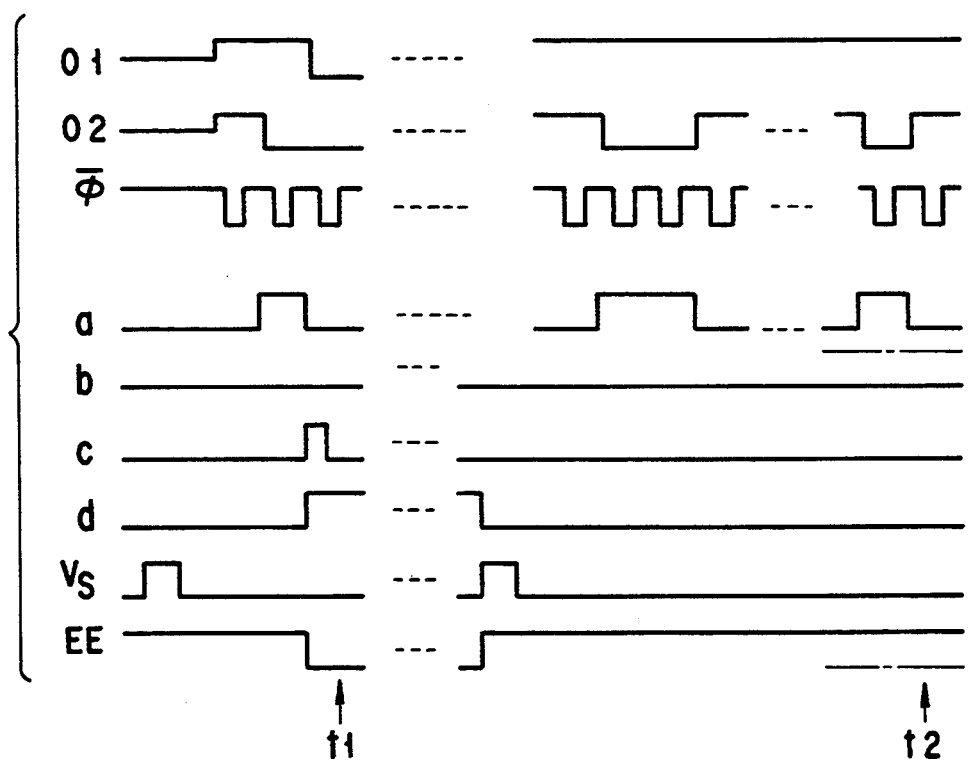
FIG. 16 is a timing chart for explaining an operation of the circuit in FIG. 15.

An operation of the circuit having the above-described arrangement will be described below with reference to the timing chart shown in FIG. 16. When data is read out from a memory cell 10, the corresponding column line potential Vin is compared with the first reference potential vrefU in the first sense amplifier 81, and is compared with the second reference potential VrefL in the second sense amplifier 82. If the column line potential Vin is higher than the first reference potential vrefU, an output signal 01 from the first sense amplifier 81 is set at logic "0". If the column line potential Vin is lower than the first reference potential vrefU, the output signal 01 from the first sense amplifier 81 is set at logic "1". Similarly, if the column line potential Vin is higher than the second reference potential VrefL, an output signal 02 from the second sense amplifier 82 is set at logic "0". If the column line potential Vin is lower than the second reference potential VrefL, the output signal 02 from the second sense amplifier 82 is set at logic "1".

If the column line potential Vin is between the first and second reference potentials VrefU and VrefL, i.e., the output signals 01 and 02 are respectively set at logic "1" and logic "0", an output signal $\bar{a}$ from the NOR circuit 84 is set at logic "1". When the signal $\bar{\phi}$ is set at logic "0", the counter 86 counts the logic-"1" output signals $\bar{a}$. A data read operation with respect to the memory cell 10 is started to check the erased state, when the signal Vs is set at logic "1". The flip-flop circuit 88 and the counter 86 are initialized by the signal Vs. If the data in the memory cell 10 is not sufficiently erased, and the column line potential Vin is higher than the first reference potential VrefU, the output signal 01 is set at logic "0". When the $\bar{\phi}$ is set logic "0", an output signal c from the NOR circuit 85, to which the output signal $\overline{01}$ and the signal $\bar{\phi}$ are input, is set at logic "1". The flip-flop circuit 88 is set by this logic-"1" output signal c, and its output signal d is set at logic "1". Time t1 in FIG. 16 indicates this state. An output signal EE from the NOR circuit 87 is set at logic "0". When the output signal EE is at logic "0", it means insufficient data erasure, and hence an erase operation is performed again. In this case, the signal Vs is set at logic "1" again to initialize the flip-flop circuit 88 and the counter 86.

The counter 86 counts the number of memory cells which cause the output signals 01 and 02 from the first and second sense amplifiers 81 and 82 to be set at logic "1" and logic "0", respectively. If the count value is larger than a predetermined value, an output signal b from the counter 86 is set at logic "1". In FIG. 16, time t2 indicates this state, and an alternate long and short dashed line indicates that the output signal b is at logic "1". Since the output signal b is at logic "1", the output signal EE from the NOR circuit 87 is set at logic "0", as indicated by an alternate long and short dashed line in FIG. 16, and an erase operation is performed again.

Assume that the number of memory cells which cause the output signals 01 and 02 from the first and second sense amplifiers 81 and 82 to be set at logic "1" and logic "0", respectively, is smaller than the predetermined value, and the potentials of all the memory cells are lower than the first reference potential VrefU. In this case, since the output signals b and d from the counter 86 and the flip-flop circuit 88 are kept at logic "0", the output signal EE from the NOR circuit 87 is also held at logic "1". Time t2 in FIG. 16 indicates this state. The output signal EE from the NOR circuit 87 is at logic "1" because the number of memory cells which cause the output signals 01 and 02 from the first and second sense amplifiers 81 and 82 to be set at logic "1" and logic "0", respectively, is smaller than the predetermined value. Upon detection of the logic-"1" output signal EE, the erase operation is ended.

Figure 17:
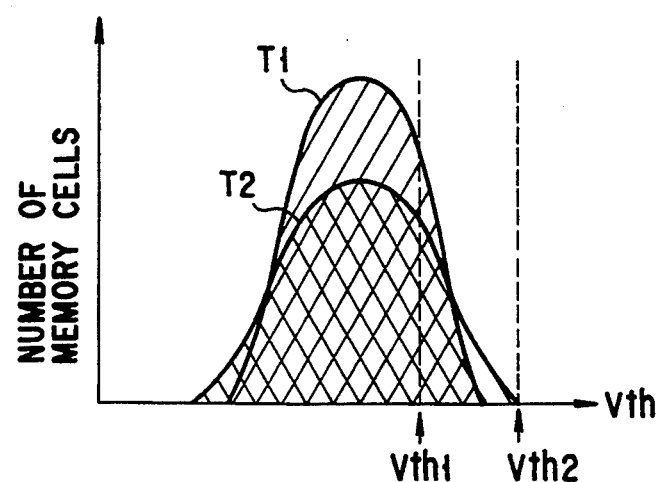
FIG. 17 is a graph for explaining an operation of the circuit in FIG. 15.

According to the fourth embodiment, as shown in FIG. 17, the number of memory cells whose threshold voltages are between Vth1 and Vth2 is set to be a predetermined number. That is, memory cells exhibiting a narrow distribution of threshold voltages after data erasure, indicated by a curve T1 in FIG. 17, are distributed to the lower threshold voltage side, as compared with the prior art. Therefore, the read speed can be increased. In addition, with regard to memory cells exhibiting a wide distribution indicated by a curve T2 in FIG. 17, the same threshold voltage as that in the prior art is ensured, thereby obtaining high-speed memory cells at a higher rate without decreasing the yield.

In the above embodiment, electrons are injected into the floating gates of memory cells, and the electrons are gradually emitted from the floating gate afterward. In contrast to this, however, electrons may be emitted from the floating gates of all the memory cells first, and electrons may be gradually injected into the memory cells afterward. A flash EEPROM using such a scheme is known as a NAND type flash EEPROM. The method explained in FIG. 17 can be applied to check the injecting state of electrons in such NAND type flash EEPROM.

In the above embodiment, the electron-emitted states of memory cells having higher threshold voltages after data erasure in the distribution are checked. However, the present invention is not limited to this. For example, the electron-emitted states of memory cells having lower threshold voltages in the distribution may be checked so that the erase operation may be stopped when the number of memory cells whose threshold voltages are between two reference potentials becomes larger than a predetermined value. Other various applications can be expected.

The fourth embodiment may be combined with the second embodiment.

The fifth embodiment of the present invention corresponding to the third object will be described next.

The principle of this embodiment will be described first with reference to FIGS. 18A, 18B, and 18C. Similar to the fourth embodiment, in the fifth embodiment, two reference potentials for a check read operation after data erasure are prepared instead of one reference potential. These two reference potentials respectively correspond to threshold voltages Vth1' and Vth2' of memory cells, shown in FIGS. 18A to 18C. The threshold voltage Vth1' is set to be lower than the threshold voltage Vth2'.

Figure 18A:
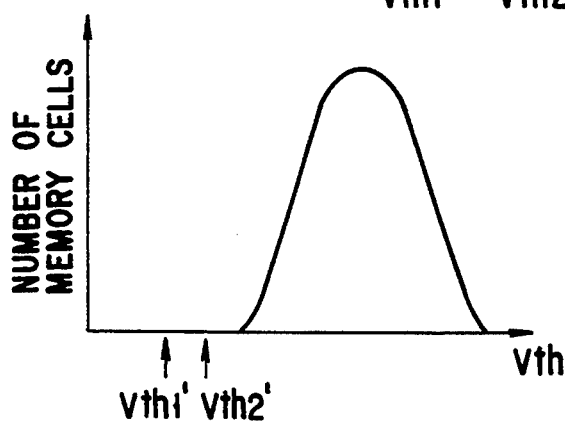
FIGS. 18A, 18B, and 18C are graphs for explaining the principle of the present invention corresponding to the fourth object.

If, as shown in FIG. 18A, the threshold voltages of memory cells are distributed at a portion higher than the threshold voltage Vth1', the erase operation is repeated. If, as shown in FIG. 18C, a memory cell having a threshold voltage lower than the threshold voltage Vth1' exists, the erase operation is ended. If, as shown in FIG. 18B, a memory cell having the lowest threshold voltage is located between Vth1' and Vth2', an erase operation is performed, for example, only once. With this erase operation, the distribution of threshold voltages shifts to the lower threshold voltage side. With one erase operation, the threshold voltage of each memory cell shifts to the negative side by a predetermined value. In the prior art, since the electron-emitted state of a floating gate is checked with one reference potential, it can be only determined whether the threshold voltage of the memory cell from which data is read out is higher or lower than the threshold voltage, but cannot be determined where a memory cell which has undergone data erasure to have the lowest threshold voltage is distributed. For this reason, in order to prevent a memory cell from having a negative threshold voltage when data erasure is repeated, a reference potential is determined to maximize the margin. Therefore, the threshold voltage of a memory cell after data erasure is not an optimal value.

The distance the threshold voltage of a memory cell shifts by one erase operation can be roughly estimated. For this reason, two reference potentials in the present invention can be set such that the threshold voltage of a memory cell does not become a negative value even after an erase operation is performed once again as long as the threshold voltage of the memory cell is set between the two reference potentials. As described above, if the threshold voltage of a memory cell becomes lower than the reference potential Vth1' when a check read operation is performed after data erasure, an erase operation is not performed any more, otherwise the threshold voltage becomes a negative value.

Figure 19:
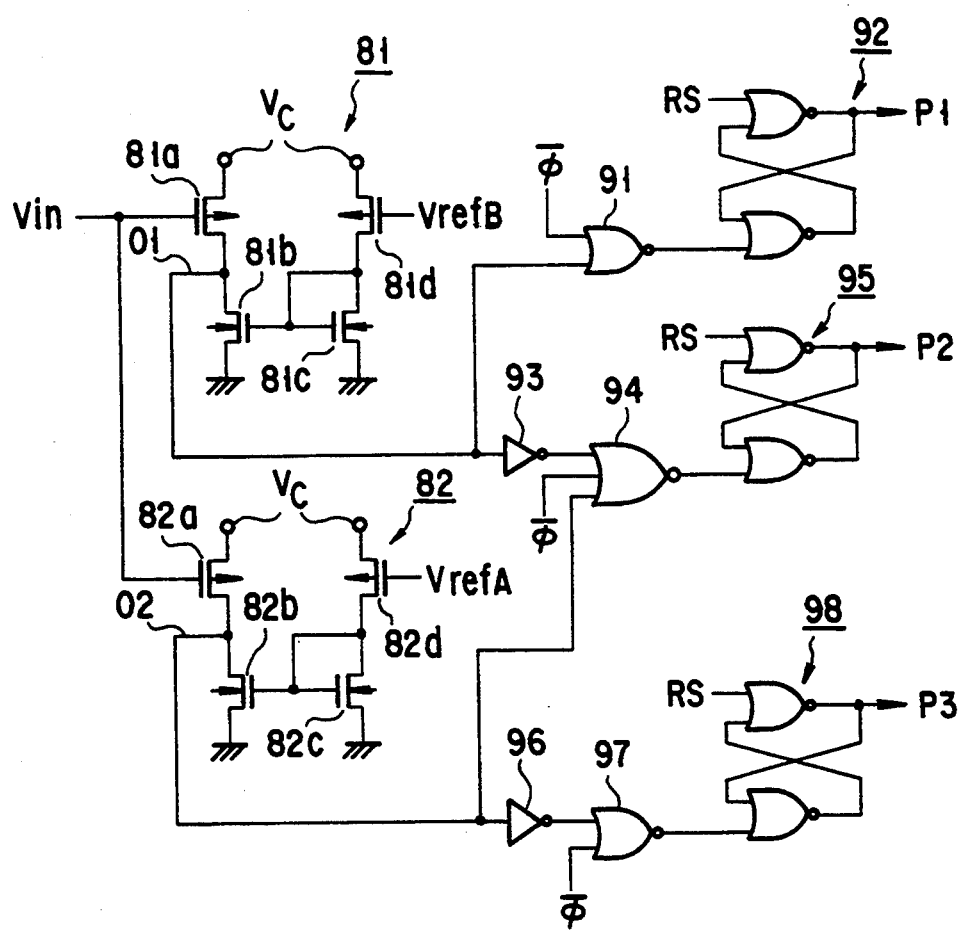
FIG. 19 is a circuit diagram showing the fifth embodiment of the present invention.

FIG. 19 shows the fifth embodiment. The same reference numerals in FIG. 19 denote the same parts as in FIG. 15.

Referring to FIG. 19, a first reference potential VrefB is applied to the gate of a transistor 81d constituting a first sense amplifier 81, whereas a second reference potential VrefA is applied to the gate of a transistor 82d constituting a second sense amplifier 82. The first and second reference voltages VrefB and VrefA respectively correspond to the threshold voltages Vth2' and Vth1' in FIGS. 18A to 18C. The node between the drains of transistors 81a and 81b, serving as the output terminal of the first sense amplifier 81, is connected to one input terminal of a NOR circuit 91. A signal $\phi$ is supplied to the other input terminal of the NOR circuit 91. The output terminal of the NOR circuit 91 is connected to one input terminal of a flip-flop circuit 92. A reset signal RS is supplied to the other input terminal of the flip-flop circuit 92. A signal P1 is output from the output terminal of the flip-flop circuit 92.

The node between the drains of the transistors 81a and 81b, serving as the output terminal of the first sense amplifier 81, is also connected to the first input terminal of a NOR circuit 94 through an inverter circuit 93. The signal $\bar{\phi}$ is supplied to the second input terminal of the NOR circuit 94. The third input terminal of the NOR circuit 94 is connected to the node between the drains of transistors 82a and 82b, serving as the output terminal of the second sense amplifier 82. The output terminal of the NOR circuit 94 is connected to one input terminal of a flip-flop circuit 95. The reset signal RS is supplied to the other input terminal of the flip-flop circuit 95. A signal P2 is output from the output terminal of the flip-flop circuit 95.

The node between the drains of the transistors 82a and 82b, serving as the output terminal of the second sense amplifier 82, is connected to one input terminal of a NOR circuit 97 through an inverter circuit 96. The signal $\bar{\phi}$ is supplied to the other input terminal of the NOR circuit 97. The output terminal of the NOR circuit 97 is connected to one input terminal of a flip-flop circuit 98. The reset signal RS is supplied to the other input terminal of the flip-flop circuit 98. A signal P3 is output from the output terminal of the flip-flop circuit 98. The output signals P1, P2, and P3 from the flip-flop circuits 92, 95, and 98 are supplied to a control circuit (not shown) for performing a data erase operation.

An operation of the circuit having the above-described arrangement will be described below with reference to FIGS. 20A to 20C.

A column line potential Vin from a selected memory cell 10 is applied to the first and second sense amplifiers 81 and 82. In the first sense amplifier 81, the column line potential Vin is compared with the first reference potential VrefB corresponding to the threshold voltage Vth2' of the memory cell 10. In the second sense amplifier 82, the column line potential Vin is compared with the second reference potential VrefA corresponding to the threshold voltage Vth1' of the memory cell 10. If the column line potential Vin is higher than the first reference potential VrefB, an output signal 01 from the first sense amplifier 81 is set at logic "0". If the column line potential Vin is lower than the first reference potential VrefB, the output signal 01 is set at logic "1". Similarly, if the column line potential Vin is higher than the second reference potential VrefA, an output signal 02 from the second sense amplifier 82 is set at logic "0". If the column line potential Vin is lower than the second reference potential VrefA, the output signal 02 is set at logic "1". When the signal $\bar{\phi}$ is at logic "0", the flip-flop circuits 92, 95, and 98 are set in accordance with the output states of the first and second sense amplifiers 81 and 82.

Prior to a check read operation for checking the erased state of each memory cell, the signal RS is set at logic "1" to reset the flip-flop circuits 92, 95, and 98. FIG. 20A shows a case wherein the potential of a column line through which data is read out from a selected memory cell is higher than the reference potentials VrefA and VreB. In this case, both the output signals 01 and 02 from the first and second sense amplifiers 81 and 82 are set at logic "0", and the flip-flop circuit 92 is set in synchronism with the timing when a signal $\phi$ is set at logic "1". As a result, the signal P1 is set at logic "1".

Figures 20A, 20B, 20C:
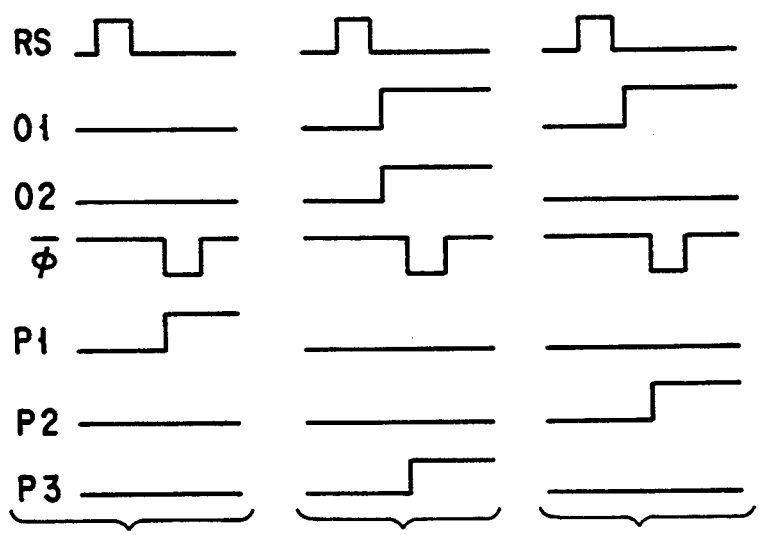
FIGS. 20A, 20B, and 20C are timing charts for explaining an operation of the circuit in FIG. 19.

FIG. 20B shows a case wherein the column line potential is lower than the reference potentials VrefA and VrefB. In this case, both the output signals 01 and 02 are set at logic "1", and the flip-flop circuit 98 is set in synchronism with the timing when the signal $\phi$ is set at logic "0". As a result, the signal P3 is set at logic "1".

FIG. 20C shows a case wherein the column line potential is set between the reference potentials VrefA and VrefB. In this case, the output signals 01 and 02 are respectively set at logic "1" and logic "0", and the flip-flop circuit 95 is set in synchronism with the timing when the signal $\phi$ is set at logic "0". As a result, the signal P2 is set at logic "1".

As shown in FIG. 21, if the threshold voltages of all the memory cells are higher than the threshold voltage Vth2, the signal P1 is set at logic "1", and the signals P2 and P3 are set at logic "0". When the signals P1 to P3 are set in these states, an erase operation is executed again.

Figure 18B:
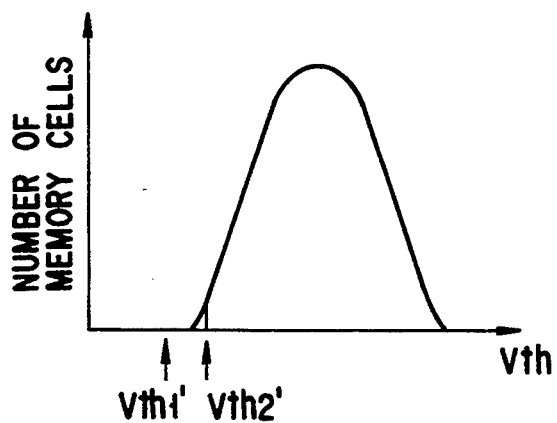
Figure 18C:
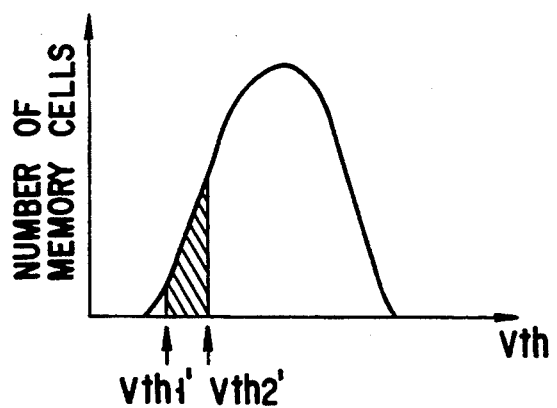

If the threshold voltage of at least one memory cell is lower than the threshold voltage Vth1, i.e., in the case shown in FIG. 18C, all the signals P1, P2, and P3 are set at logic "1". When the signal P1 to P3 are set in this state, the erase operation is ended. In this case, the erase operation may be stopped upon detecting that the signal P3 is set at logic "1".

If the threshold voltage of at least one memory cell is between the threshold voltages Vth1 and Vth2, i.e., in the case shown in FIG. 18B, both the signals P1 and P2 are set at logic "1", and the signal P3 is set at logic "0". When the signals P1 to P3 are set in these states, an erase operation is performed only once after this check read operation, i.e., a high voltage is applied to the source of a memory cell to emit electrons from the floating gate, and the erase operation is stopped.

The number of times that this data erase operation is performed is not limited to only one, and may be set to be two or three responding to a erasing characteristic of a memory cell.

According to the fifth embodiment, an erase operation is stopped by checking a specific range to which the threshold voltage of a memory cell having the lowest threshold voltage belongs. Since the threshold voltage of each memory cell after data erasure can be optimally set, the amount of current flowing in each memory cell can be larger than that in the prior art, thus providing a nonvolatile semiconductor memory device having a high read speed.

The sixth embodiment of the present invention corresponding to the fourth object will be described next.

The principle of this embodiment will be described first. In the embodiment, in order to inject electrons to the floating gates of all memory cells simultaneously, all outputs from a row decoder 11 are set in a selected state, and a high voltage is applied to the control gates of all memory cells 10. At this time, the channel regions of the memory cells are set to 0 volts. With this operation, the potential of the floating gate of each memory cell is increased by utilizing capacitive coupling between the control gate and the floating gate, and electrons are caused to inject from the channel region into the floating gate by using the tunnel effect. In this case, all the memory cells can be simultaneously set in an electron-injected state so that the erase time can be shortened as compared with the prior art.

In general, the time required for a normal write operation of injecting electrons into the floating gate of one memory cell by flowing a current to the channel region is 0.1 ms, whereas the time required for electron injection by means of the tunnel effect is 100 ms. A large current flows in the normal write operation in which a current is supplied to the channel region of each memory cell to inject electrons into the floating gate. For this reason, a write operation cannot be performed with respect to a large number of memory cells at once, and is performed in units of 8 bits. For example, in a 1M-bit memory having a 128K×8 bit arrangement, it takes 128,000×0.1 ms=12.8 sec to completely write data in all the memory cells.

In contrast to this, by using the electron injection method based on the tunnel effect as in this embodiment, electrons can be injected in all the memory cells at once because the current consumption is almost zero. In the embodiment, therefore, it takes only 100 ms to completely write data in all the memory cells, achieving a great reduction in erase time as compared with the prior art. More specifically, in the embodiment, a normal data write operation is performed by the method of injecting electrons into the floating gate of each memory cell by flowing a current to the channel region, because different data must be written in the respective memory cells. In this case, it takes about 0.1 ms to write data in one memory cell. When electrons are to be injected into the floating gates of all the memory cells before a data erase operation, the method based on the tunnel effect is used. With this method, electrons are injected into the floating gates of all the memory cells at once, thus greatly shortening the erase time as compared with the prior art.

FIG. 22 shows the sixth embodiment, specifically a row decoder. FIG. 22 shows only a portion of a row decoder 100. The source of a p-channel transistor 101 is connected to a power supply Vc. A signal PW supplied from, e.g., a peripheral circuit (not shown) is supplied to the gate of the transistor 101. A plurality of n-channel transistors $102_1$ to $102_0$ are connected in series between the drain of the transistor 101 and ground. Address signals A1 ($\overline{A1}$), A2 ($\overline{A2}$), ..., An ($\overline{An}$) are respectively supplied to the gates of the n-channel transistors $102_1$ to $102_n$. A signal $\overline{E}$ is supplied to the gate of the n-channel transistor $102_0$. An n-channel transistor 103 is connected between the drain of the transistor 101 and ground. The signal PW is supplied to the gate of the transistor 103. The drain of an n-channel transistor 104 is connected to the drain of the transistor 101. The power supply Vc is connected to the gate of the transistor 104. The source of the transistor 104 is connected to the gate of a p-channel transistor 106, the gate of an n-channel transistor 107, and the drain of a p-channel transistor 108. The transistors 106 to 108 constitute a latch circuit 105. A voltage SW is applied to the source of the transistor 106. The drain of the transistor 106 is connected to the drain of the transistor 107. The source of the transistor 107 is grounded. The drains of the transistors 106 and 107 are connected to the gate of the transistor 108. The voltage SW is applied to the source of the transistor 108. Selection signals WL1 (to WLi) are output from the drains of the transistors 106 and 107. A circuit for generating the voltage SW will be described later.

FIG. 23 shows the waveforms of selection signals WL (WL1 to WLi) output from the row decoder 100 in the respective modes, and of the signal PW. An operation of the circuit shown in FIG. 22 will be described below with reference to FIG. 23.

When data is to be read out from a memory cell, the signal PW is set at logic "0" to set the transistors 101 and 103 in ON and OFF states, respectively. In this case, as a voltage SW, a voltage is externally applied from the power supply Vc (e.g., 5V). Therefore, the potential of a selected row line WL becomes equal to that of the power supply Vc, and each non-selected row line WL is set at 0 V.

Similarly, in a data write operation, the signal PW is set at logic "0". In this case, as a voltage SW, a high voltage Vp (e.g., 12 V) for writing is externally applied. Therefore, a selected row line WL is set at the high voltage Vp, and each non-selected row line WL is set at 0 V.

When electrons are to be injected into all the memory cells before a data erase operation, the signal PW is set at logic "1" to set the transistors 101 and 103 in OFF and ON states, respectively. In this case, as the voltage SW, a high voltage of, e.g., about 20 V obtained by boosting the high voltage Vp in the integrated circuit is used. Therefore, a high voltage of about 20 V is applied to all the row lines.

In a data erase operation, the signal $\overline{E}$ is set at logic "0" to set all the row lines at 0 V.

Figure 24:
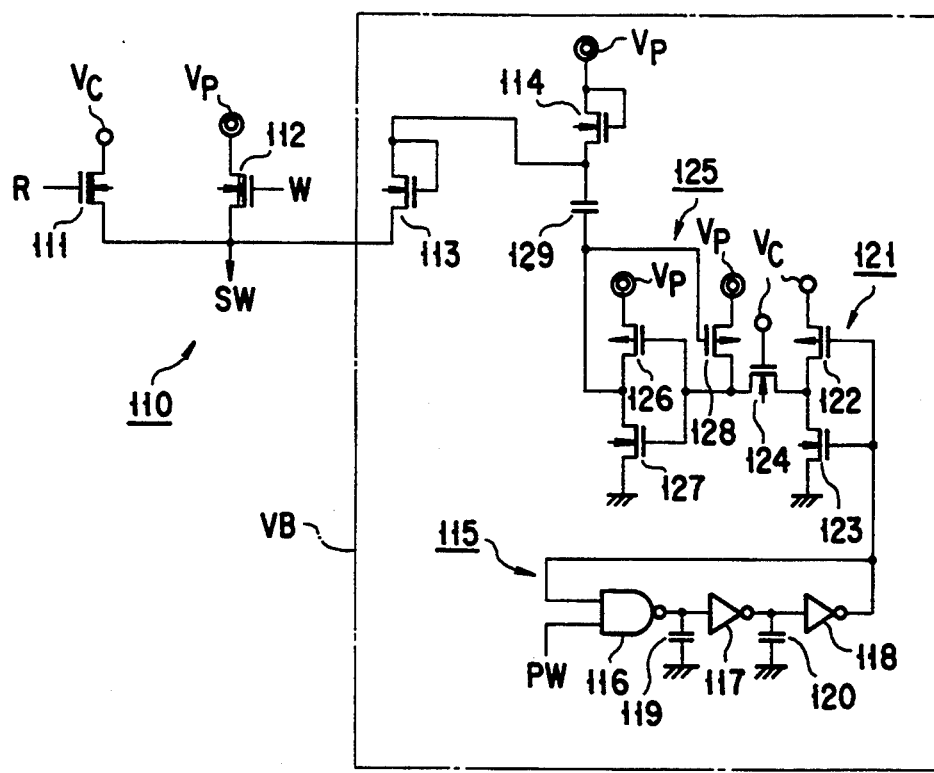
FIG. 24 is a circuit diagram showing a circuit for generating a voltage SW in FIG. 22.

FIG. 24 shows a voltage generating circuit 110 for generating the voltage SW.

The drain of a depletion type n-channel transistor 111 is connected to the power supply Vc. A signal R generated by a peripheral circuit (not shown) is supplied to the gate of the transistor 111. The source of the transistor 111 is connected to the source of a depletion type n-channel transistor 112 and to the source of an enhancement type n-channel transistor 113 constituting a booster circuit VB. The above-mentioned voltages SW are output from the sources of these transistors 111, 112, and 113. The drain of the transistor 112 is connected to the high voltage Vp. A signal W generated by a peripheral circuit (not shown) is supplied to the gate of the transistor 112.

In the booster circuit VB, the drain of the transistor 113 is connected to its gate and is also connected to the source of an n-channel transistor 114. The drain of the transistor 114 is connected to its gate and is also connected to the high voltage Vp.

An oscillator 115 is constituted by a NAND circuit 116, inverter circuits 117 and 118, and capacitors 119 and 120, all of which are connected in series. The capacitor 119 is connected between ground and the connection node between the NAND circuit 116 and the inverter circuit 117. The capacitor 120 is connected between ground and the connection node between the inverter circuits 117 and 118. The output terminal of the inverter circuit 118 is feedback-connected to one input terminal of the NAND circuit 116. The signal PW is supplied to the other input terminal of the NAND circuit 116. Oscillation of the oscillator 115 is controlled by this signal PW. The output terminal of the inverter circuit 118, serving as the output terminal of the oscillator 115, is connected to the gates of p- and n-channel transistors 122 and 123 constituting an inverter circuit 121. The source of the transistor 122 is connected to the power supply Vc. The source of the transistor 123 is grounded. The drains of the transistors 122 and 123 are connected to the drain of an n-channel transistor 124. The power supply Vc is connected to the gate of the transistor 124. The source of the transistor 124 is connected to the gate of a p-channel transistor 126, the gate of an n-channel transistor 127, and the drain of a p-channel transistor 128. The transistors 126 to 128 constitute a latch circuit 125. The source of the transistor 126 is connected to the high voltage Vp. The drain of the transistor 126 is connected to the drain of the transistor 127. The source of the transistor 127 is grounded. The drains of the transistors 126 and 127 are connected to the gate of the transistor 128. The source of the transistor 128 is connected to the high voltage Vp. The drains of the transistors 126 and 127 are connected to one terminal of a capacitor 129. The other terminal of the capacitor 129 is connected to the source of the transistor 114.

In the above-described arrangement, when data is read out from a memory cell 10, the signal R and the potential of the power supply Vp are set at the same potential as that of the power supply Vc, and the signals W and PW are set at 0 V. As a result, the transistors 111 and 112 are turned on and off, respectively, and the oscillation of the oscillator 115 is stopped. Therefore, the voltage SW is set to be equal to that of the power supply Vc.

When data is to be written in a memory cell, the signal W is set at Vp, and the signals R and PW are set at 0 V. As a result, the transistors 111 and 112 are turned off and on, respectively, and the oscillator 115 is stopped. Therefore, the voltage SW is set to be equal to that of the power supply Vp.

when electrons are to be injected into all the memory cells before a data erase operation, the signal PW is set at logic "1", and the signals W and R are set at 0 V. As a result, both the transistors 111 and 112 are turned off, and the oscillation of the oscillator 115 occurs. Consequently, the voltage SW is set to be a high voltage of about 20 V, which is obtained by the booster circuit VB.

According to the sixth embodiment, a normal data write operation is performed by the method of injecting electrons into the floating gate of each memory cell by flowing a current to the channel region. With this method, a data write operation can be performed in about 0.1 ms per memory cell. Furthermore, in electron injection before a data erase operation, electrons are injected into the floating gates of all the memory cells at once by using the tunnel effect, thereby providing a nonvolatile semiconductor memory device which can greatly shorten the erase time as compared with the prior art.

The seventh embodiment of the present invention corresponding to the fourth object will be described next.

The principle of this embodiment will be described first. In the embodiment, the data in all the memory cells are erased without performing a write operation with respect to all the memory cells before an erase operation. Electrons are excessively emitted from the floating gates of all the memory cells, and the threshold voltage of each memory cell is stably kept negative. Thereafter, all outputs from a row decoder are set in a selected state, and a high voltage is applied to the control gates of all the memory cells. With this operation, the potential of the floating gate of each memory cell is increased by utilizing capacitive coupling between the control gate and the floating gate, and electrons are caused to inject from the channel region of the memory cell into the floating gate by using the tunnel effect. In this case, by using a method that all the memory cells are simultaneously injected electrons, the threshold voltage of the memory cell can be set the same as the threshold voltage after the conventional erase operation. As a result, an erase operation can be completed in a short period of time as compared with the prior art.

In general, the time required for a normal write operation of injecting electrons into the floating gate of one memory cell by flowing a current to the channel region of the memory cell is 0.1 ms, whereas the time required for electron injection by means of the tunnel effect is about 100 ms. That is, the times in the two methods are on different orders. A large current flows in the normal write operation in which a current is supplied to the channel region of each memory cell to inject electrons into the floating gate. For this reason, a write operation cannot be performed with respect to a large number of memory cells at once, and is performed in units of 8 bits. For example, in a 1M-bit memory having a 128K×8 bit arrangement, it takes 128,000×0.1 ms=12.8 sec to completely write data in all the memory cells.

In contrast to this, in the electron injection method based on the tunnel effect as in this embodiment, the current consumption is almost zero. For this reason, electrons can simultaneously be injected/emitted into/from all the memory cells. It takes only 200 ms to complete an erase operation. That is, a great reduction in erase time can be achieved, as compared with the prior art. More specifically, in the embodiment, a normal data write operation is performed by the method of injecting electrons into the floating gate of each memory cell by flowing a current to the channel region, because different data must be written in the respective memory cells. In this case, it takes about 0.1 ms to write data in one memory cell. In a data erase operation, electrons are emitted/injected from/into the floating gates of all the memory cells at once by using the tunnel effect, thereby greatly shortening the erase time as compared with the prior art.

Figure 25:
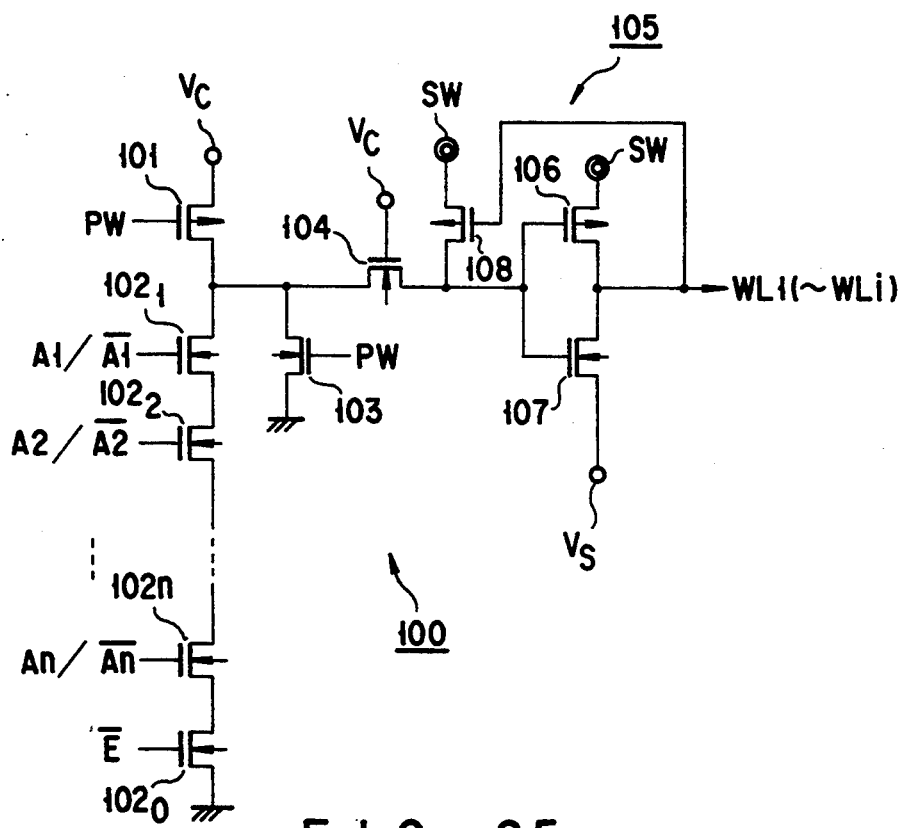
FIG. 25 is a circuit diagram showing a row decoder according to the seventh embodiment of the present invention.

FIG. 25 shows a row decoder according to the seventh embodiment. The same reference numerals in FIG. 25 denote the same parts as in FIG. 22, and only different portions will be described below. In this embodiment, the source of an n-channel transistor 107 constituting a latch circuit 105 is connected to a voltage Vs. This voltage Vs is changed in accordance with an operating mode of the row decoder. A voltage SW is generated by the circuit shown in FIG. 24.

In the above-described arrangement, as a voltage SW, a voltage is externally applied from the power supply Vc (e.g., 5 V) in a data read operation. In a data write operation with respect to each memory cell, as a voltage SW, a high voltage VP (e.g., 12 V) for writing is externally applied. When electrons are to be injected into all the memory cells before data erasure, a high voltage of, e.g., about 20 V, obtained by boosting the voltage VP, is applied as a voltage SW. In a data read operation, a selected row line WL is set at the potential of the power supply Vc, and each non-selected row line WL is set at 0 V. Similarly, in a data write operation, a selected row line WL is set at the potential corresponding to the voltage VP, and each non-selected row line is set at 0 V. In an electron injection operation with respect to all the memory cells prior to a data erase operation, the signal PW is set at logic "1" to apply a high voltage of about 20 V to all the row lines.

A date erase operation of this embodiment will be described in further detail below with reference to FIG. 26.

In the erase mode, electrons are emitted from the floating gate of each memory cell 10. In this operation, similar to the prior art, the control gates of all the memory cells, i.e., the row lines WL, are set at 0 V, and a potential VE of the source of each memory cell 10 is set at a high voltage, e.g., 12 V, thus emitting electrons from the floating gate to the source.

This operation of emitting electrons may be performed by applying a high voltage to the drain of each memory cell. Alternatively, the semiconductor substrate itself on which the memory cell arrays are formed may be set at a high voltage to emit electrons from the floating gates to the drains, the sources, and the channels.

In an electron emit operation, a signal $\overline{E}$ is set at logic "0", and an output WL from the row decoder shown in FIG. 25 is set at 0 V, as described above. In order to set the floating gates of all the memory cells in a uniform state, this electron emit operation is performed until the electron emit is saturated and the threshold voltage of each memory cell ceases to change.

After the electron emit is completed, all the row lines WL are set in a selected state, and a high voltage of, e.g., 20 V is applied to the control gate of each memory cell to inject electrons from the source, the drain, and the channel region into the floating gate. At this time, the source potential VE of each memory cell is set at 0 V. The signal PW supplied to the row decoder shown in FIG. 25 is set at logic "1" to set all the row lines in a selected state. When electrons are injected into the floating gate of each memory cell, the threshold voltage of the memory cell increases. This threshold voltage must be lower than the threshold voltage of the memory cell in a normal write operation.

Each memory cell 10 stores binary data. In a normal write operation, each memory cell is caused to correspond to either logic "0" or logic "1" of binary data. In this case, a high voltage is applied to the control gate of the memory cell to inject electrons from the source, the drain, and the channel into the floating gate. This memory cell is caused to correspond to either logic "0" or logic "1" by using the threshold voltage of the memory cell as a criterion. For example, a memory cell which has undergone a normal write operation is not rendered conductive even if it is selected. However, the threshold voltage, of a memory cell, which is increased upon injection of electrons in the erase mode is sufficiently low to render the memory cell conductive when it is selected, and allow a sufficiently large current to flow therein. In addition, the memory cell must be turned off when it is set in a non-selected state. For this reason, the time during which a high voltage is applied to the control gate of each memory cell is set to be sufficiently short, and the amount of electrons injected into the floating gate is checked after injection.

In this check read operation, all the row lines WL are set in a non-selected state and are set at the voltage vs. Thereafter, a column line is selected by a column decoder 12, and column line potentials are detected by a sense amplifier in units of column lines. When memory cells are in a nonconductive state, the corresponding column line is charged by a load transistor 17, and the sense amplifier detects this. When memory cells are in a conductive state, the corresponding column line is discharged through the memory cells, and the sense amplifier detects this. In this case, since electrons are not sufficiently injected, a high voltage is applied to the control gate of each memory cell to perform injection of electrons again. In a check read operation of checking the amount of electrons injected, the control gate of each memory cell is set at a low potential. The memory cell is turned off unless the threshold voltage is higher than the potential of the control gate. Therefore, the threshold voltage of the memory cell can be controlled to be a voltage low enough to allow a sufficient large current to flow in the memory cell when it is selected.

FIGS. 27A and 27B show circuits for generating the voltage Vs applied to each row line WL in a check read operation. FIG. 27A shows a case wherein the voltage Vs is the ground potential. In this case, the control gate of each memory cell in a check read operation is set at 0 V. Therefore, when the threshold voltage of a memory cell slightly exceeds 0 V, the memory cell is turned off. Since the threshold voltage of a memory cell is slightly higher than 0 V, a large current flows in the memory cell. However, even slight leakage of electrons from the floating gate of a memory cell make the threshold voltage of the memory cell negative, resulting in poor reliability.

FIG. 27B shows another circuit for generating the voltage Vs.

The signal $\overline{E}$ is supplied to one input terminal of a NAND circuit 132 through an inverter circuit 131. The signal R is supplied to the other input terminal of the NAND circuit 132. The output terminal of the NAND circuit 132 is connected to the gates of n- and p-channel transistors 133 and 134. The source of the transistor 133 is grounded. The drain of the transistor 133 is connected to the source of the transistor 107 and to a connection terminal 135 for outputting the voltage Vs. The source of the transistor 134 is connected to the power supply Vc. The drain of the transistor 134 is connected to the drain and gate of an n-channel transistor 136 and to the connection terminal 135. The source of the transistor 136 is grounded.

In the above-described arrangement, in a check read operation, the signal $\overline{E}$ is set at logic "0", and the signal R is set at logic "1". Consequently, an output signal from the NAND circuit 132 is set at logic "0". The transistor 133 is turned off, and the transistors 134 and 136 are turned on. The voltage Vs becomes almost equal to the threshold voltage of the transistor 136. When the threshold voltage of a memory cell slightly exceeds the threshold voltage of the transistor 136, the memory cell is turned off. Therefore, a large amount of electrons are accumulated in the floating gate, ensuring good reliability. However, since the threshold voltage of the memory cell is higher than that in the case wherein the voltage Vs is equal to the ground potential, the amount of current flowing in the memory cell decreases. In this manner, the voltage Vs in a check read operation must be carefully set.

In a normal read operation, both the signals $\overline{E}$ and R are set at logic "1". Consequently, an output signal from the NAND circuit 132 is set at logic "1". The transistor 133 is turned on, and the transistors 134 is turned off. The ground potential is applied as the voltage Vs through the transistor 133. Therefore, in a normal read operation, each non-selected row line WL is set at the ground potential as in the prior art.

According to the seventh embodiment, in the erase mode, the threshold voltages of a plurality of memory cells are simultaneously set by using the tunnel effect, thereby providing a nonvolatile semiconductor memory device having a shorter erase time than the prior art.

What is claimed is:

1. A nonvolatile semiconductor memory device comprising:
    a memory cell array including memory cells arranged in row and column directions in the form of a matrix, each of said memory cells including a MOS transistor having a floating gate, and storing data in accordance with a storage state of charges of
    programming means for programming the storage state of one of said memory cells by injecting charges into the floating gate of said one memory cell or by emitting a charge from the floating gate;
    check means for checking the storage state of charges in the floating gate of said one memory cell by reading out data from said one memory cell, said one memory cell having a threshold voltage varying depending on the amount of charges in the floating gate; and
    programming stop means for stopping the programming, wherein the programming stop means counts a number of the memory cells having threshold voltages between two predetermined reference voltages in response to an output signal from the check means, and stops the programming performed by said programming means when the count becomes smaller than a predetermined value,
    said check means including first and second sense amplifiers and a load circuit, the load circuit being connected to the memory cells, said first sense amplifier comparing a potential of a connection node between said one memory cell and the load circuit with a first reference potential (VrefL), and said second sense amplifier comparing the potential of the connection node with a second reference potential (VrefU), the compared result by the first and second sense amplifiers being outputted as the output signal to the programming stop means from the check means.

2. A nonvolatile semiconductor memory device comprising:
- a memory cell array including memory cells arranged in row and column directions in the form of a matrix, each of said memory cells including a MOS transistor having a floating gate, and storing data in accordance with a storage state of charges of the floating gate;
- programming means for programming the storage state of one of said memory cells by injecting charges into the floating gate of said one memory cell or by emitting charges from the floating gate;
- check means for checking the storage state of charges of the floating gate of said one memory cell by reading out data from said one memory cell, said one memory cell having a threshold voltage varying depending on the amount of charges of the floating gate; and
- programming stop means for stopping the programming, wherein the programming stop means counts a number of the memory cells having threshold voltages between two predetermined reference voltages in response to an output signal from the check means, and stops the programming performed by said programming means when the count becomes larger than a predetermined value,
- said check means including first and second sense amplifiers and a load circuit, the load circuit being connected to the memory cells, said first sense amplifier comparing a potential of a connection node between said one memory cell and the load circuit with a first reference potential (VrefL), and said second sense amplifier comparing the potential of the connection node with a second reference potential (VrefU), wherein the compared result by the first and second sense amplifiers is outputted as the output signal to the programming stop means from the check means.

3. A nonvolatile semiconductor memory device comprising:
- a memory cell array including memory cells arranged in matrix form having row lines and column lines, each of said memory cells including a MOS transistor having a floating gate, and storing data in accordance with a storage state of charges of the floating gate, the memory cells in the same row being commonly connected to one of the row lines, the memory cells in the same column being commonly connected to one of the column lines;
- programming means for programming the storage state of one of said memory cells by injecting charges into the floating gate of said one memory cell or by emitting charges from the floating gate;
- check means for checking the storage state of charges of the floating gate of said one memory cell in accordance with a potential of a column line, said one memory cell having a threshold voltage varying depending on the amount of charges of the floating gate, wherein the potential of the column line corresponds to the threshold voltage of the one memory cell; and
- programming stop means for stopping the programming, wherein the programming stop means counts a number the memory cells having threshold voltages between two predetermined reference voltages in response to an output signal generated from the check means by detecting the potential of the column line, and stopping the programming performed by said programming means when the count becomes larger than a predetermined value,
- said check means including first and second sense amplifiers for detecting the potential of the column line, said first sense amplifier comparing the potential of the column line with a first reference potential (VrefL), and said second sense amplifier combating the potential of the column line with a second reference potential (VrefU), wherein the compared result by the first and second sense amplifiers is outputted as the output signal to the programming stop means from the check means.

4. A nonvolatile semiconductor memory device comprising:
- a memory cell array including memory cells arranged in matrix form having row lines and column lines, each of said memory cells including a MOS transistor having a floating gate, and storing data in accordance with a storage state of charges of the floating gate, the memory cells in the same row being commonly connected to one of the row lines, the memory cells in the same column being commonly connected to one of the column lines;
- programming means for programming the storage state of one of said memory cells by injecting charges into the floating gate of said one memory cell or by emitting charges from the floating gate; and
- check means for checking the storage state of charges of the floating gate of said one memory cell in accordance with a potential of a column line, said one memory cell having a threshold voltage varying depending on the amount of charges of the floating gate and the potential of the column line corresponding to the threshold voltage of the one memory cell,
- said check means including first and second sense amplifiers for detecting the potential of the column line, said first sense amplifier comparing the potential of the column line with a first reference potential (VrefA), and said second sense amplifier comparing the potential of the column line with a second reference potential (VrefB), the programming means emitting electrons from the floating gate of each of said memory cells when the potential of the column line detected by the first sense amplifier and the potential of the column line detected by the second sense amplifier are higher than the first and second reference potentials, the programming means stopping the programming operation when at least one of the potentials detected by the first and second sense amplifiers is lower than the first and second reference potentials, and the programming means emitting electrons from the floating gate of each of said memory cells a predetermined number of times and performs no programming operation afterward when at least one of the potentials detected by the first and second sense amplifiers is between the first and second reference potentials, and the potentials detected by the first and second sense amplifiers are not lower than the first and second reference potentials.

* * * * *